(12) United States Patent
Hamaoka

(10) Patent No.: US 7,489,716 B2
(45) Date of Patent: Feb. 10, 2009

(54) SEMICONDUCTOR LASER DEVICE, METHOD FOR MANUFACTURING THE SAME AND OPTICAL PICKUP APPARATUS

(75) Inventor: Osamu Hamaoka, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 15 days.

(21) Appl. No.: 11/655,130

(22) Filed: Jan. 19, 2007

(65) Prior Publication Data
US 2007/0165684 A1    Jul. 19, 2007

(30) Foreign Application Priority Data
Jan. 19, 2006    (JP)    ............................. 2006-011694

(51) Int. Cl.
*H01S 3/04* (2006.01)
(52) U.S. Cl. ............................. 372/34; 372/36; 372/87
(58) Field of Classification Search .................. 372/34, 372/36, 87
See application file for complete search history.

(56) References Cited

U.S. PATENT DOCUMENTS

2002/0100912 A1*   8/2002   Ishiguro et al. ............... 257/81

FOREIGN PATENT DOCUMENTS

| CN | 1265529 A | 9/2000 |
|---|---|---|
| JP | 10-256649 | 9/1998 |
| JP | 11-265956 | 9/1999 |
| JP | 2000-077792 | 3/2000 |
| JP | 2000-340875 | 12/2000 |
| JP | 2001-015846 | 1/2001 |
| JP | 2002-232059 | 8/2002 |

\* cited by examiner

*Primary Examiner*—Dung T Nguyen
(74) *Attorney, Agent, or Firm*—Morrison & Foerster LLP

(57) ABSTRACT

A semiconductor laser chip is mounted on one surface of an electrode lead for chip mounting having a heat release region for releasing heat around the semiconductor laser chip. Therefore, it is possible to release heat of the semiconductor laser chip to the chip mounting lead and release the heat from the heat release region, thereby suppressing increase of a temperature of the semiconductor laser chip and suppressing shortening of life of the semiconductor laser chip.

11 Claims, 13 Drawing Sheets

SEMICONDUCTOR LASER DEVICE, METHOD FOR MANUFACTURING THE SAME AND OPTICAL PICKUP APPARATUS

CROSS-REFERENCE TO RELATED APPLICATION

This application claims priority to Japanese Patent Application No. JP 2006-11694, which was filed on Jan. 19, 2006, the contents of which, are incorporated herein by reference, in their entirety.

BACKGROUND OF THE INVENTION

1. Field of the Invention

The present invention relates to a semiconductor laser device that is equipped with a semiconductor laser chip and is used as, for example, a light source of an optical pickup apparatus for an optical disk system, and also relates to a method for manufacturing the semiconductor laser device.

2. Description of the Related Art

FIG. 14 is a perspective view illustrating a configuration of a related art semiconductor laser device 1. The semiconductor laser device 1 disclosed in Japanese Unexamined Patent Publication JP-A 2002-232059 comprises: an island portion 4 that is a component made of metal including a reference face 2 and a block portion 3 protruding in a direction substantially perpendicular to the reference face 2; a lead 5; a resin portion 7 integrally formed with the island portion 4 and the lead 5 so as to fix a relative positional relation between the island portion 4 and the lead 5; a laser chip 8 fixed to the block portion 3; and a light receiving element 9 directly fixed to the resin portion 7. The laser chip 8 and the light receiving element 9 are covered with a cap 11 connected to the island portion 4 by resistance welding.

Further, in a semiconductor laser device disclosed in Japanese Unexamined Patent Publication JP-A 10-256649(1998), an island on which a laser diode chip and a light receiving element are mounted is made of resin, on which a lead pin is disposed in a skewered form. To the island is provided a cap that covers the laser diode chip and the light receiving element. The laser diode chip is fixed to the island via a monitoring photodiode.

In Japanese Unexamined Patent Publication JP-A 11-265956 (1999) is disclosed a cavity package, although not a semiconductor laser device, which comprises a package main body in which a metal lead frame is embedded; a semiconductor IC (integrated circuit) provided on the lead frame and bonded thereto by a bonding wire; and a lid made of the same thermoplastic material as that of the package main body and fused by ultrasonic fusing means for performing ultrasonic fusion on the package main body.

In the art disclosed in JP-A 2002-232059, the cap 11 is welded to the island portion 4 by resistance welding. In resistance welding, electric energy is converted into thermal energy to melt contact portions of metals, and the contact portions are pressurized and joined. Therefore, there is a possibility that the laser chip 8 fixed to the island portion 4 is heated via the island portion 4 having high thermal conductivity, which may cause a decrease of yield rate.

Since the island is made of resin in the art disclosed in JP-A 10-256649, there is no possibility that the laser chip is heated. However, since the island and the cap are fixed to each other by fitting or engaging, there is a need to provide the island and the cap with fitting portions or engaging portions. In the case of forming the fitting portions or engaging portions, there is a problem that it is difficult to make the device small and moisture or the like is easy to penetrate through a gap into the device. Moreover, it is also described to use an adhesive to fix the cap and island together with fixing by fitting or fixing by engaging. However, in the case of fixing the cap and island using the adhesive, there is a need to make a region to apply the adhesive, and hence, there is a problem that downsizing is hindered. Furthermore, since the laser diode chip is fixed to the island made of resin via the monitoring photodiode, and heat generated when the laser diode chip emits light is hard to be released, there is a problem such that life of the laser diode chip is shortened.

Further, in the art disclosed in JP-A 11-265956, by integrating the package main body and the lid by ultrasonic fusion, a need for forming the region to apply the adhesive required when connecting the package main body and the lid with the adhesive is eliminated, so that it is possible to downsize the device. However, the art disclosed in JP-A 11-265956 is not applied to a semiconductor laser device, and there is a problem that it is impossible to sufficiently release heat even if mounting a semiconductor laser chip in place of the semiconductor IC.

SUMMARY OF THE INVENTION

Accordingly, an object of the invention is to provide a semiconductor laser device capable of being firmly attached with a cap without complicate processes, thereby increasing productivity, and capable of suppressing shortening of life of a semiconductor laser chip caused by heat generation and being downsized, to provide a method for manufacturing the semiconductor laser device, and to provide an optical pickup apparatus.

The invention provides a semiconductor laser device comprising:

a semiconductor laser chip;

a plurality of electrode leads that are electrically conductive and include an electrode lead for chip mounting on which the semiconductor laser chip is mounted;

a base made of synthetic resin, for holding the electrode leads in an embedded state, the base being electrically insulating and having a protruding portion on which the semiconductor laser chip is mounted, and a face formed at a basal end of the protruding portion to face an emission direction of a laser beam emitted by the semiconductor laser chip; and a cap made of synthetic resin, the cap having an opening formed so as to face an emission end face of the semiconductor laser chip, and being integrally joined to the base in a state of covering the protruding portion, on the face formed at the basal end of the protruding portion, wherein one surface of the electrode lead for chip mounting is exposed from the protruding portion, and the one surface has a heat release region broader than a region for mounting the semiconductor laser chip, around the semiconductor laser chip.

According to the invention, the base holds the electrode leads in an embedded state, so that the plurality of electrode leads are held by the base in a state where a relative position is fixed. Since the base is electrically insulating, short circuit does not occur between the electrode leads via the base. In particular, even if an interval between the leads is narrowed, or even if the semiconductor laser device is shocked from outside in a manufacturing process, a checking process, a process of incorporating into the apparatus or the like, short circuit does not occur between the electrode leads. Since both the base and the cap are made of synthetic resin and are made of the same kind of material, the base and the cap can be firmly fixed to each other when integrally formed. Moreover, by integrally joining, it is possible to increase productivity without complicating a process because there is no need to adhere with an adhesive, and moreover, it is possible to form the device small in size because there is no need to form a region to apply the adhesive. Furthermore, in a case where both the base and the cap are made of synthetic resin, it is possible to fuse at a lower temperature when integrally joining, as compared with a case where the both are made of metal. For example, since it is possible to join in a shorter time period as compared with a case of fusing metal and synthetic resin, it is possible to increase productivity.

Since the cap is integrally joined to the base in a state of covering the protruding portion, on the face formed at the basal end of the protruding portion and oriented to the emission direction of the laser beam emitted by the semiconductor laser chip, it is possible to certainly prevent that a mechanical shock is directly given to the semiconductor laser chip. Since the cap has the opening formed so as to face the emission end face of the semiconductor laser chip, it is possible to emit the laser beam emitted by the semiconductor laser chip to the outside in a state where the laser beam is not blocked by the cap, even if the protruding portion is covered with the cap.

The one surface of the electrode lead for chip mounting is exposed from the protruding portion, and the semiconductor laser chip is mounted on the one surface. Since the one surface has the heat release region broader than the region for mounting the semiconductor laser chip, around the mounted semiconductor laser chip, it is possible to cause the electrode lead to conduct heat generated when the semiconductor laser chip emits light, thereby releasing the heat from the heat release region. Since the base is made of synthetic resin, thermal conductivity is low. However, since it is possible to cause the electrode lead having high thermal conductivity to conduct the heat from the semiconductor laser chip and release the heat, it is possible to suppress increase of a temperature of the semiconductor laser chip, and suppress shortening of life of the semiconductor laser chip.

Further, in the invention, it is preferable that a color of the synthetic resin of the cap is black.

According to the invention, the color of the synthetic resin of the cap is black. Therefore, for example, even if low-reflection plating or coating is not applied to an inner surface of the cap, the cap absorbs light heading toward the cap of the light emitted by the semiconductor laser chip, whereby it is possible to suppress reflection on the inner surface of the cap. Accordingly, it is possible to suppress that the laser beam emitted by the semiconductor laser chip is reflected on the inner surface of the cap and becomes disturbing light.

Furthermore, in the invention, it is preferable that an inner surface of the cap is formed into a rough face.

According to the invention, an inner surface of the cap is formed into a rough face, so that it is possible to further suppress that the laser beam emitted by the semiconductor laser chip is reflected on the inner surface of the cap and becomes disturbing light.

Still further, in the invention, it is preferable that the cap is provided with a light transmitting member that closes the opening and transmits light having a predetermined wavelength which light is emitted by the semiconductor laser chip.

According to the invention, the light transmitting member for transmitting the light having the predetermined wavelength which light is emitted by the semiconductor laser chip closes the opening, so that it is possible to suppress entry of foreign matter such as dust from outside into a space covered with the cap. Consequently, it is possible to suppress deterioration of the end face of the semiconductor laser chip, and realize extension of life of the device.

Still further, in the invention, it is preferable that a thickness of a wall portion of the cap that is connected with the face formed at the basal end of the protruding portion is selected so as to be more than 0.2mm, and the face formed at the basal end of the protruding portion protrudes 0.4 mm or more outwardly from a circumference of the cap.

According to the invention, the thickness of the wall portion of the cap that is connected with the face formed at the basal end of the protruding portion is selected so as to be more than 0.2 mm, and the face formed at the basal end of the protruding portion protrudes 0.4mm or more outwardly from the circumference of the cap, whereby it is possible to secure sufficient mechanical strength of the cap, and moreover, stably seal by the cap. Moreover, it is possible to sufficiently secure an area of the face formed at the basal end of the protruding portion and, when attaching the semiconductor laser device to an attachment object, it is possible to attach to the attachment object in a state where an optical axis direction of the light emitted by the semiconductor laser device is fixed to a specified direction with reference to the face formed at the basal end of the protruding portion.

Still further, in the invention, it is preferable that the thickness of the wall portion of the cap that is connected with the face formed at the basal end of the protruding portion is set to 0.4 mm.

According to the invention, the thickness of the wall portion of the cap that is connected with the face formed at the basal end of the protruding portion is set to 0.4 mm, whereby it is possible to secure mechanical strength of the cap enough to prevent a mechanical change by ultrasonic vibrations at the time of ultrasonic fusion, and stably seal by the cap without making the cap large in size.

Still further, in the invention, it is preferable that a space between the electrode leads is filled with the base.

According to the invention, all the spaces between the electrode leads are filled with the resin of the base. Therefore, even if the electrode leads are formed so that portions connected to an external circuit are long, it is possible to suppress that the electrode leads are bent and become faulty in the manufacturing process and the checking process and a yield rate decreases. Since the electrode leads are integrally held with the base, it is possible to easily cut the electrode leads at the time of use, for example. Accordingly, it is possible to increase productivity of an electronic apparatus manufactured with the semiconductor laser device.

Still further, in the invention, it is preferable that the semiconductor laser device further comprises a light receiving element disposed in the protruding portion, and the base is formed by joining two resin formed parts each of which holds the electrode leads, and one of which has the face formed at the basal end of the protruding portion, the electrode lead for chip mounting and a region on which the light receiving element is mounted.

According to the invention, the base is made by ultrasonic fusion of the two portions each holding the electrode leads. In the case of placing the electrode leads in line in each of two directions and molding with resin as in the arts disclosed in JP-A 2002-232059 and JP-A 10-256649, it is necessary to highly accurately hold the adjacent electrode leads in each of the two directions, and hence, its formation is difficult. However, by joining the portions each holding the electrode leads in line in one direction so that the electrode leads of each of the portions become parallel, it is possible to produce the device while highly accurately arranging the electrode leads in each of the two directions.

Furthermore, since the face formed at the basal end of the protruding portion, the electrode lead for chip mounting, and the region on which the light receiving element is mounted are disposed in one of the two resin formed parts, it is possible to manufacture so that a relative position of the semiconductor laser chip and the face formed at the basal end of the protruding portion is as specified in the design, regardless of assembly accuracy when joining the two resin formed parts to form the base.

Still further, in the invention, it is preferable that the semiconductor laser device further comprises a hologram element that is disposed in the cap and includes a light transmitting base member having a surface in a direction leaving the semiconductor laser chip on which surface a hologram pattern is formed and the hologram pattern is formed so that a center thereof is shifted to a side of an end of the hologram element in a direction leaving the light receiving element with respect to a center of the hologram element.

According to the invention, it is only diffraction light diffracted toward the light receiving element by the hologram pattern that should be received by the light receiving element, and even if the hologram pattern is formed so that the center of the hologram pattern is shifted to the side of the end of the hologram element in the direction leaving the light receiving element with respect to the center of the hologram element, the diffraction light is transmitted by the base member and received by the light receiving element in the same manner as in a case where the hologram pattern is formed so that the center thereof is aligned with the center of the base member. Therefore, it becomes possible to maintain performance and properties of the hologram pattern and also downsize the hologram element.

Still further, in the invention, it is preferable that the base and the cap are made of polyphenylene sulfide.

According to the invention, the base and the cap are made of polyphenylene sulfide, so that it is possible to realize resin formation with excellent mass-productivity and stability, fine thermal resistance, and stable adhesion strength by ultrasonic fusion.

Still further, the invention provides an optical pickup apparatus comprising:

the semiconductor laser device mentioned above;

a chassis member having a contact face contacting the face formed at the basal end of the protruding portion of the semiconductor laser device; and an optical system member disposed in the chassis member with reference to the contact face.

According to the invention, the semiconductor laser device is attached to the contact face of the chassis member in a state where the face formed at the basal end of the protruding portion contacts the contact face. Since the chassis member is provided with the optical system member such as a lens with reference to the contact face, it is possible to attach the semiconductor laser device and the optical system member so that a relative relation is highly accurate. Moreover, in a case where the light receiving element is disposed in the semiconductor laser device, it is possible to attach the semiconductor laser device and the optical system member so that the relative position is highly accurate, and a balance of focus signals obtained by the light receiving element is not lost, so that it is possible to realize the optical pickup apparatus that is capable of performing focus adjustment with high accuracy.

Still further, the invention provides a method for manufacturing a semiconductor laser device comprising the steps of:

embedding a plurality of electrode leads that are electrically conductive and include an electrode lead for chip mounting on which the semiconductor laser chip is mounted, in a base made of synthetic resin which base is electrically insulating and has a protruding portion on which the semiconductor laser chip is mounted, and a face which is formed at a basal end of the protruding portion to face an emission direction of a laser beam emitted by the semiconductor laser chip, to hold the plurality of electrode leads in an embedded state;

mounting the semiconductor laser chip on the electrode lead for chip mounting;

connecting the semiconductor laser chip and the electrode leads by bonding-wires;

placing a cap which is made of synthetic resin and has an opening, on a reference face so that the opening faces an emission end face of the semiconductor laser chip and a part of the face formed at the basal end of the protruding portion outwardly protrudes; and joining the base and the cap by ultrasonic fusion.

According to the invention, the base holds the electrode leads in an embedded state, so that the plurality of electrode leads are held by the base in a state where a relative position therebetween is fixed. Since the base is electrically insulating, short circuit does not occur between the electrode leads via the base. Since both the base and the cap are made of synthetic resin and are made of the same kind of material, it is possible to integrate the base and the cap when joining by ultrasonic fusion, and it is possible to secure stable adhesion strength and firmly fix. Moreover, by integrally joining the base and the cap by ultrasonic fusion, it is possible to increase productivity without complicating a process because there is no need to adhere with an adhesive, and moreover, it is possible to form the device small in size because there is no need to form a region to apply the adhesive. Furthermore, in a case where both the base and the cap are made of synthetic resin, it is possible to fuse by ultrasonic waves at a lower temperature when integrally joining, as compared with a case where the both are made of metal. For example, since it is possible to join in a shorter time period as compared with a case of fusing metal and synthetic resin by ultrasonic waves, it is possible to increase productivity.

Since the cap is integrally joined to the base in a state of covering the protruding portion, on the face formed at the basal end of the protruding portion and oriented to the emission direction of the laser beam emitted by the semiconductor laser chip, it is possible to certainly prevent that a mechanical shock is directly given to the semiconductor laser chip. Since the cap has the opening formed so as to face the emission end face of the semiconductor laser chip, it is possible to emit the laser beam emitted by the semiconductor laser chip to the outside in a state where the laser beam is not blocked by the cap, even if the protruding portion is covered with the cap.

The one surface of the electrode lead for chip mounting is exposed from the protruding portion, and the semiconductor laser chip is mounted on the one surface. Since the one surface has the heat release region for releasing heat, around the mounted semiconductor laser chip, it is possible to cause the electrode lead to conduct heat generated when the semiconductor laser chip emits light, thereby releasing the heat from the heat release region. Since the base is made of synthetic resin, thermal conductivity is low. However, since it is possible to cause the electrode lead having high thermal conductivity to conduct the heat from the semiconductor laser chip and release the heat, it is possible to suppress increase of a temperature of the semiconductor laser chip, and suppress shortening of life of the semiconductor laser chip.

Further, in the case of making the cap with synthetic resin, it is possible to easily manufacture with stable dimensional accuracy and flatness as compared with a case of forming by drawing a thin metal plate, so that it is possible to make dimensions of a produced device close to design dimensions, and it is possible to make sizes and qualities of the semiconductor laser devices uniform at the time of mass production.

Still further, in the invention, it is preferable that the cap is formed by injecting resin into a mold having a rough face so that the rough face confronts a face to be an inner surface of the cap.

According to the invention, the cap is formed by injecting resin into the mold. The mold is formed so as to have a rough surface, and a cap can be easily obtained which has an inner rough surface only by injecting a resin. Since it is possible to form the cap and roughen the inner surface of the cap simultaneously, roughening the inner surface of the cap can be achieved without increasing producing processes.

BRIEF DESCRIPTION OF THE DRAWINGS

Other and further objects, features, and advantages of the invention will be more explicit from the following detailed description taken with reference to the drawings wherein.

DETAILED DESCRIPTION

Figure 1:
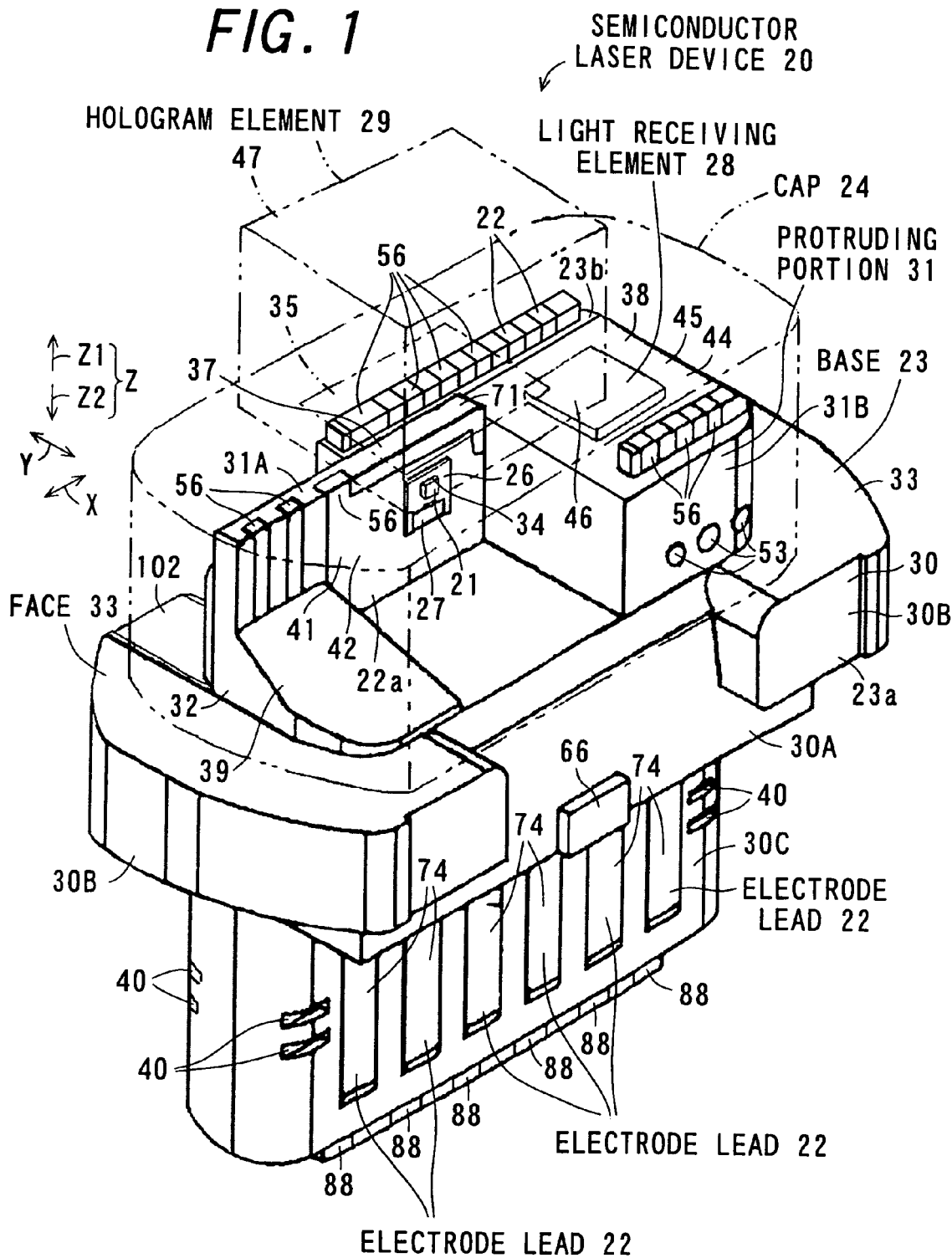
FIG. 1 is a perspective view illustrating a configuration of a semiconductor laser device according to one embodiment of the invention.

Now referring to the drawings, preferred embodiments of the invention are described below.

Figure 2:
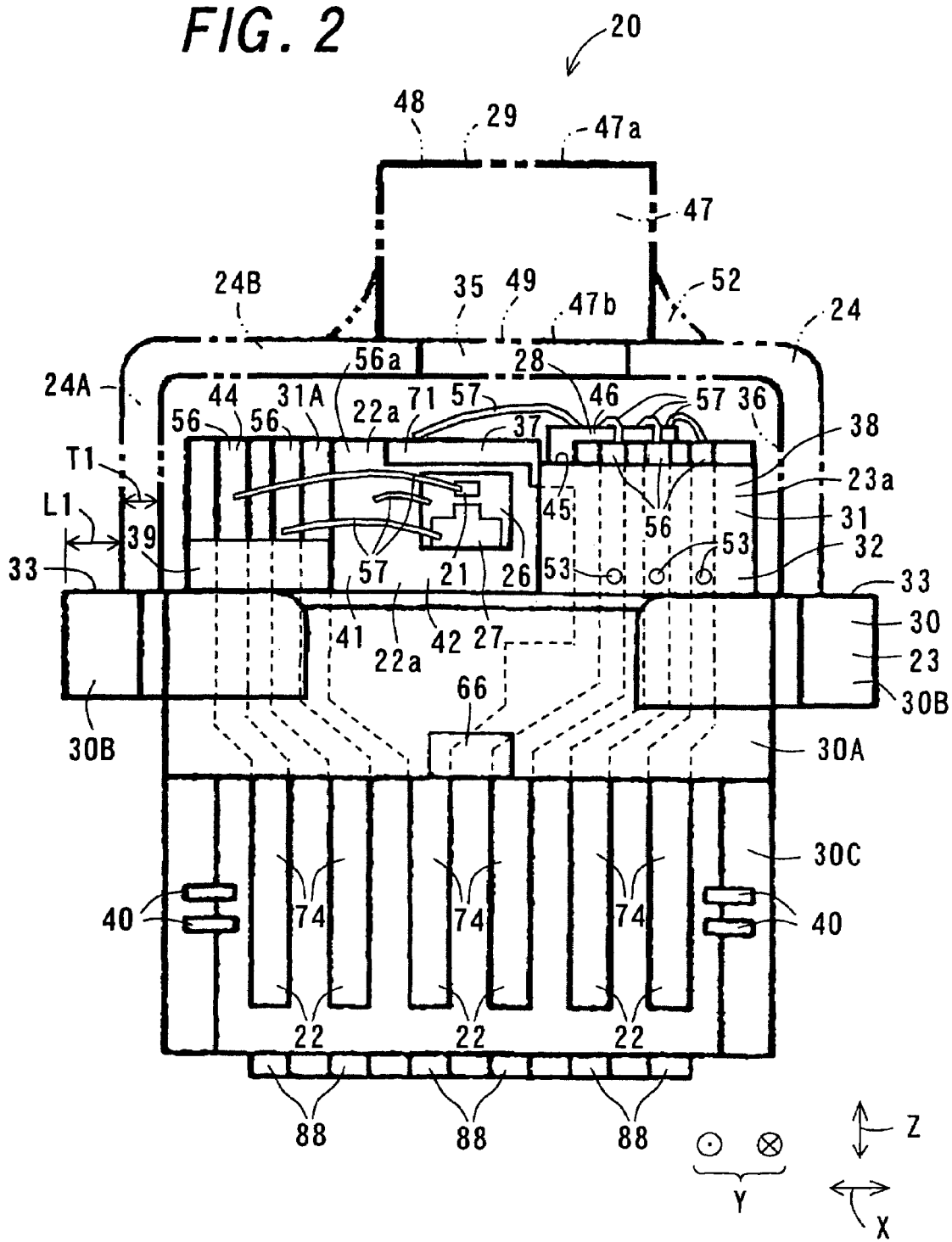
FIG. 2 is a front view illustrating the configuration of the semiconductor laser device.
Figure 3:
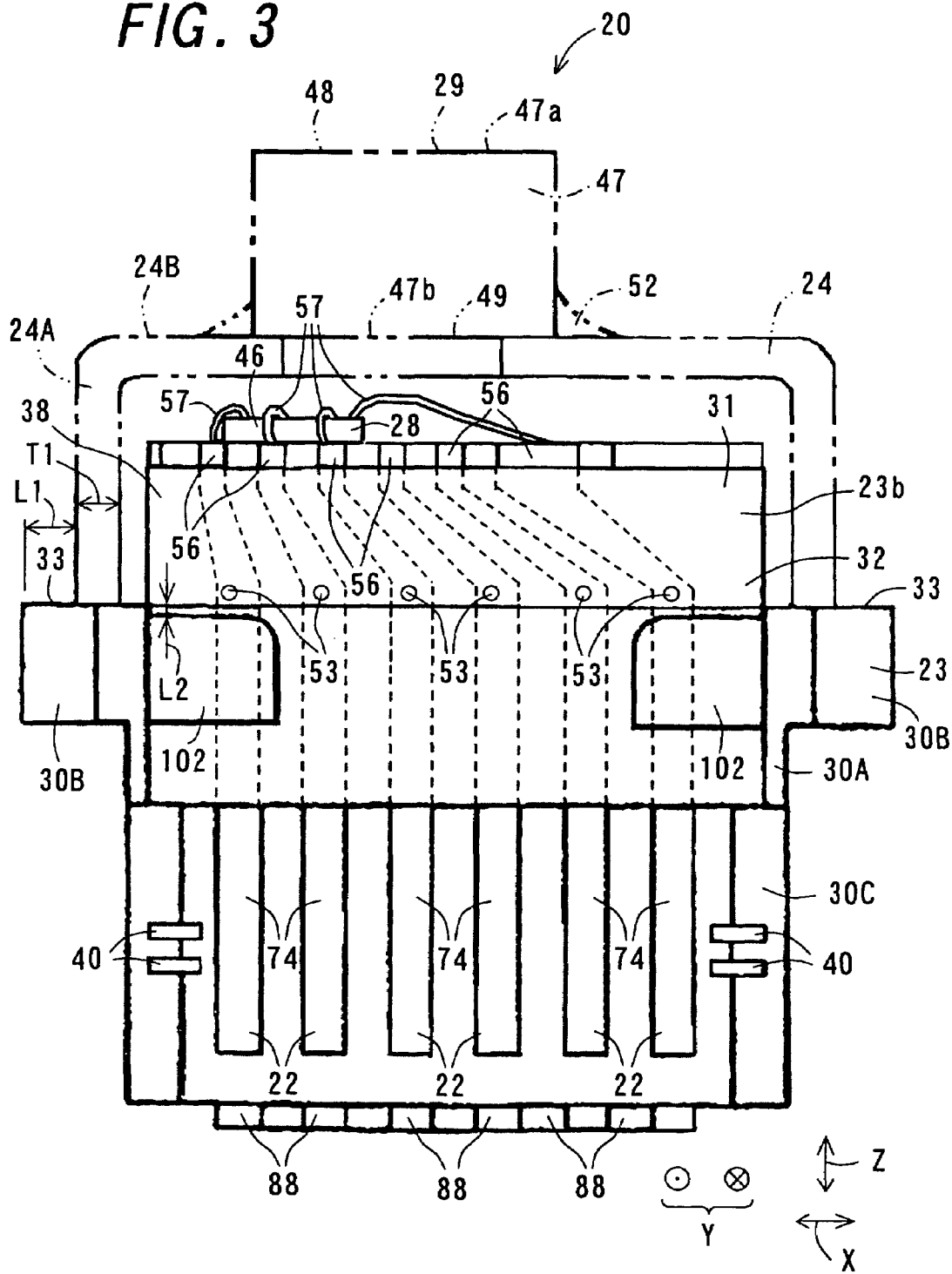
FIG. 3 is a rear view illustrating the configuration of the semiconductor laser device.
Figure 4:
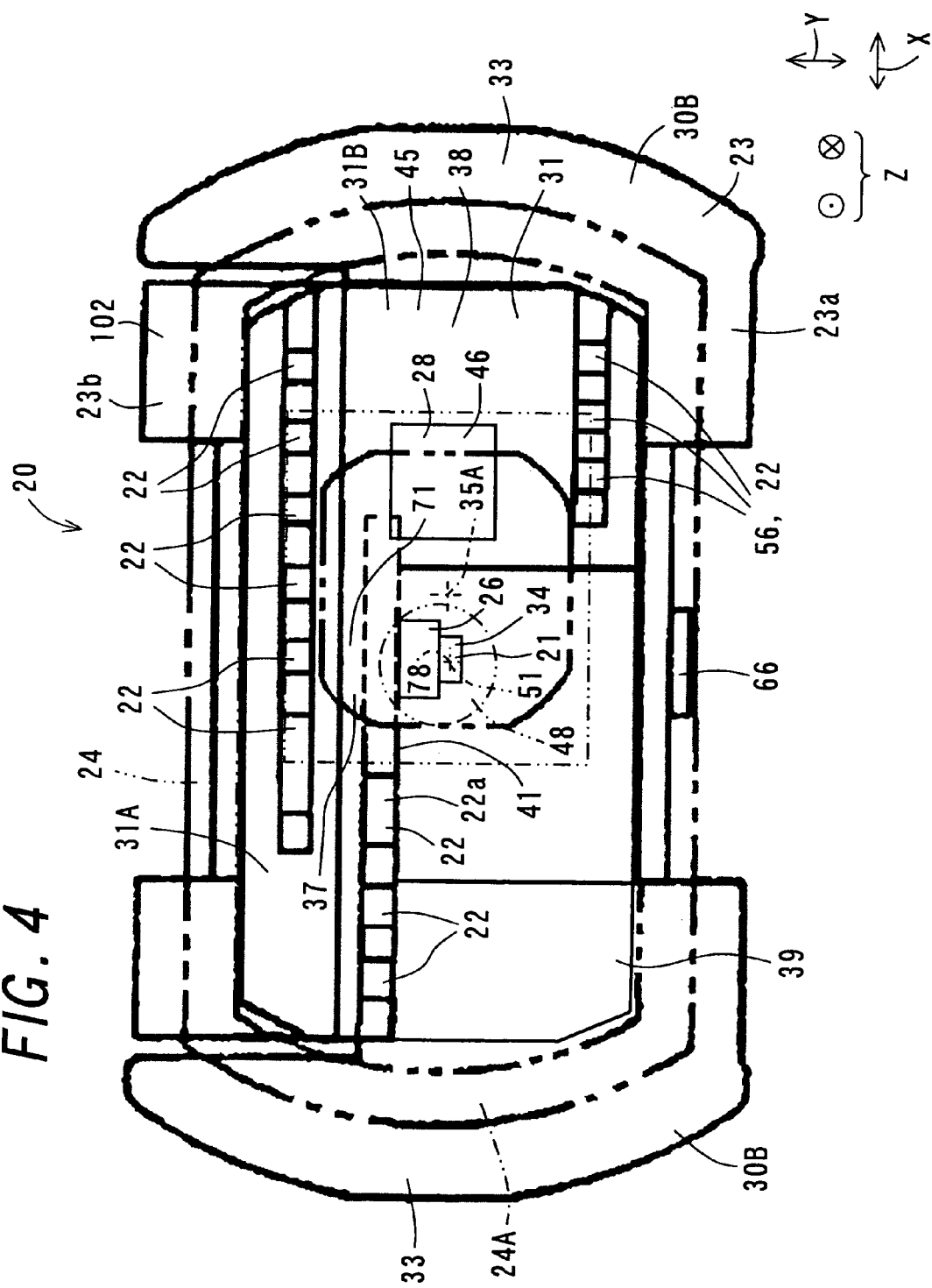
FIG. 4 is a plan view illustrating the configuration of the semiconductor laser device.
Figure 5:
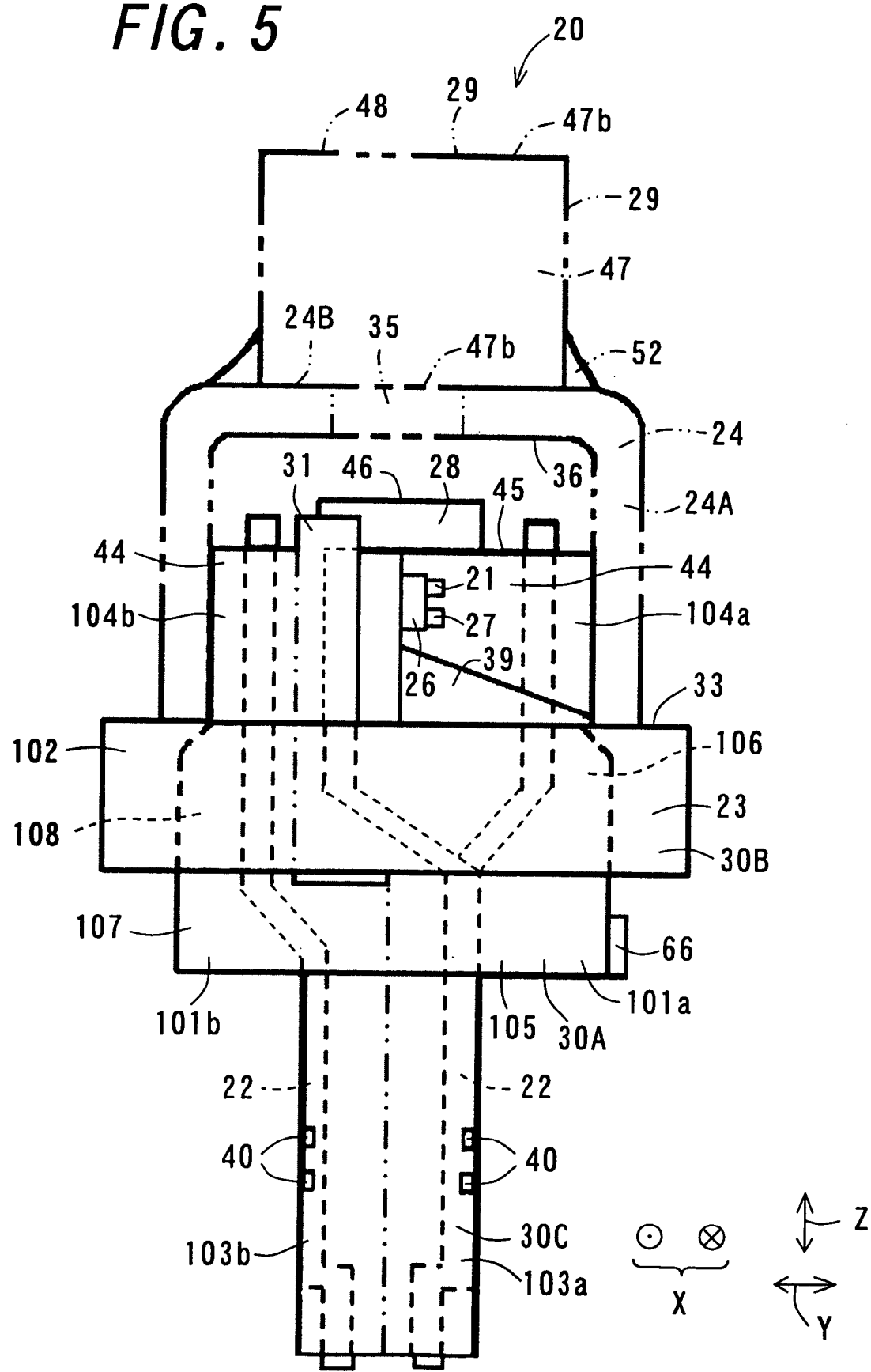
FIG. 5 is a left side view illustrating the configuration of the semiconductor laser device.

FIG. 1 is a perspective view illustrating a configuration of a semiconductor laser device 20 according to one embodiment of the invention. FIG. 2 is a front view illustrating the configuration of the semiconductor laser device 20, FIG. 3 is a rear view illustrating the configuration of the semiconductor laser device 20, FIG. 4 is a plan view illustrating the configuration of the semiconductor laser device 20, and FIG. 5 is a left side view illustrating the configuration of the semiconductor laser device 20. In FIGS. 1, 4 and 5, illustration of bonding wires 57 is omitted in order to prevent that the views become complicated.

The semiconductor laser device 20 comprises a semiconductor laser chip 21, a plurality of electrode leads 22, a base 23, and a cap 24. The semiconductor laser device 20 of the present embodiment further comprises a sub mount 26, a monitoring light receiving portion 27, a light receiving element 28, and a hologram element 29.

The semiconductor laser chip 21 is made of semiconductor such as gallium arsenide (GaAs). The semiconductor laser chip 21 emits light of a wavelength of, for example, about 650 nm, and is used as a light source for reading from and writing in a DVD (digital versatile disk).

The respective electrode leads 22 are electrically conductive, and are made of an electrically conductive metal such as aluminum (Al) or copper (Cu). The plurality of electrode leads 22 include an electrode lead 22a for mounting a chip on which the semiconductor laser chip 21 is mounted. Hereafter, the electrode lead 22a for mounting the chip may be referred to as the chip mounting lead 22a. The respective electrode leads 22 are embedded and held in the base 23.

The base 23 has a main body 30, and a protruding portion 31 that protrudes from the main body 30 and on which the semiconductor laser chip 21 is mounted. The base 23 is made of polyphenylene sulfide (PPS) which is electrically insulating synthetic resin.

The main body 30 has a face 33 formed so as to be connected with a basal end 32 of the protruding portion 31 and so as to be oriented to an emission direction Z of a laser beam emitted by the semiconductor laser chip 21. The face 33 is formed by a plane perpendicular to the emission direction Z. The semiconductor laser device 20 emits a laser beam emitted to one side Z1 of the emission direction Z of the semiconductor laser chip 21, to the outside. The face 33 is connected with the end of the protruding portion 31 on the other side Z2 of the emission direction Z. The face 33 is a reference for attachment positions of the semiconductor laser chip 21 and the light receiving element 28 in the semiconductor laser device 20, and is used as a reference face at the time of attachment of the semiconductor laser device 20 to another component.

The main body 30 includes a base portion 30A, a face forming portion 30B that is connected with each end in a long side direction X of the base portion 30A and forms the face 33, and a connecting portion 30C that protrudes opposite to the protruding portion 31 from the base portion 30A. The main body 30 is formed so as to be symmetrical with respect to a virtual plane that passes through a center in the long side direction X and is perpendicular to the long side direction X. The base portion 30A is provided with a protrusion 66 protruding to one side of a short side direction Y, at an end on the other side Z2 of the emission direction Z. The protrusion 66 is formed in order to visually distinguish a direction of the semiconductor laser device 20 with ease.

The protruding portion 31 is connected with one end in a thickness direction parallel to the emission direction Z of the base portion 30A. The base portion 30A is formed into a substantially rectangular shape. The protruding portion 31 is formed between the ends in the long side direction X of the base portion 30A. The face forming portion 30B protrudes outward from the base portion 30A, at each end in the long side direction X of the base portion 30A. A circumferential face of a free end in the long side direction X of the face forming portion 30B is formed so as to curve outward like a convex around an axial line along the emission direction Z. The connecting portion 30C is connected with the other end in the thickness direction parallel to the emission direction Z of the base portion 30A. The connecting portion 30C is formed between the ends in the long side direction X of the base portion 30A. Moreover, a thickness of the connecting portion 30C in the short side direction Y perpendicular to both the emission direction Z and the long side direction X is selected so as to be smaller than that of the base portion 30A.

The base 23 holds the respective electrode leads 22 in an embedded state, and holds in a state where the electrode leads are embedded in the base portion 30A, the connecting portion 30C and the protruding portion 31. Of the respective electrode leads 22, portions held by the base portion 30A are entirely embedded in the base portion 30A, and portions held by the connecting portion 30C and portions held by the protruding portion 31 are embedded in the connecting portion 30C and the protruding portion 31 in a partly exposed state. Since the electrode leads 22 are held in an embedded state in the base 23, the plurality of electrode leads 22 are held in the base 23 so that a relative position is fixed. Since the base 23 is electrically insulating, short circuit does not occur between the electrode leads 22 via the base 23.

The protruding portion 31 has a first protruding portion 31A having a laser chip mounting portion 37 on which the semiconductor laser chip 21 is mounted, and a second protruding portion 31B having a light receiving element mounting portion 38 having a light receiving element mounting face 45 on which the light receiving element 28 is mounted. The first protruding portion 31A and the second protruding portion 31B are connected along the long side direction X. The light receiving element mounting face 45 is formed in parallel with the face 33. A thickness in the short side direction Y of the laser chip mounting portion 37 of the first protruding portion 31A is selected so as to be smaller than a thickness in the short side direction Y of the second protruding portion 31B. The first protruding portion 31A is formed so as to extend to a center portion of the protruding portion 31 in the long side direction X, and the laser chip mounting portion 37 is formed in the center portion. At an end of the first protruding portion 31A that is opposite to the second protruding portion 31B in the long side direction X, a reinforcement portion 39 whose thickness in the short side direction Y increases as it goes toward the base portion 30A is formed.

Further, the protruding portion 31 has a hole 53 where a part of the electrode lead 22 is exposed, at a side portion in the short side direction Y. The hole 53 is disposed in the basal end 32 of the protruding portion 31. An inner diameter of the hole 53 is selected so as to be smaller than a width of the electrode lead 22. The hole 53 is a mark of a pressing pin provided on a mold in order to prevent that a position of a lead frame 61 provided inside a first resin formed part 23a and a second resin formed part 23b varies at the time of resin molding.

On one surface portion in a direction perpendicular to the short side direction Y of the laser chip mounting portion 37, a part of the chip mounting lead 22a is embedded and held. Of the chip mounting lead 22a, one surface 41 of a portion disposed in the laser chip mounting portion 37 is a plane perpendicular to the short side direction Y.

The semiconductor laser chip 21 is provided on the one surface 41 of the chip mounting lead 22a held by the laser chip mounting portion 37, at a center portion 71 of the protruding portion 31 in the long side direction X. The semiconductor laser chip 21 is provided so that an emission end face 34 becomes substantially parallel to the face 33 in order to emit a laser beam in a direction substantially perpendicular to the face 33. The semiconductor laser chip 21 is mounted on the one surface 41 of the chip mounting lead 22a via the sub mount 26. The laser chip mounting portion 37 is formed so that the semiconductor laser chip 21 mounted on the one surface 41 of the chip mounting lead 22a is substantially in the middle of the short side direction Y of the base portion 30A when seen from one side of the emission direction Z.

The semiconductor laser chip 21 is mounted on the chip mounting lead 22a via the sub mount 26. The semiconductor laser chip 21 is joined to the sub mount 26. The sub mount 26 serves as a pedestal for joining the minute semiconductor laser chip 21 to the chip mounting lead 22a, and also functions as a heat release potion, namely, a heat sink for quickly releasing heat generated when the semiconductor laser chip 21 emits light. Dimensions of the semiconductor laser chip 21 are set to about 0.2 mm long, 0.2 mm wide and 0.1 mm thick. The sub mount 26 is made of a semiconductor material. The sub mount 26 is formed into a substantially rectangular shape. Dimensions of one surface in the thickness direction of the sub mount 26 on which the semiconductor laser chip 21 is mounted is set to about 1 mm long, 1 mm and wide and 0.3 mm thick.

The light receiving element mounting portion 38 has the light receiving element mounting face 45 parallel to the face 33, at a free end 44 of the protruding portion 31. The light receiving element 28 is mounted on the light receiving element mounting face 45 with die-bond. The light receiving element 28 is realized by, for example, a four-division light receiving element. A light receiving face 46 of the light receiving element 28 is disposed so as to face the one side Z1 of the emission direction Z.

The semiconductor laser chip 21 is mounted at a middle portion between the basal end 32 and the free end 44 of the protruding portion 31, and is provided on the other side Z2 of the emission direction Z more than the light receiving element mounting face 45. Therefore, a laser beam emitted by the semiconductor laser chip 21 does not directly head toward the light receiving face 46 of the light receiving element 28.

The sub mount 26 is die-bonded and fixed on the one surface 41 of the chip mounting lead 22a, and the chip mounting lead 22a functions as a heat sink together with the sub mount 26. The one surface 41 of a portion of the chip mounting lead 22a that is exposed from the protruding portion 31, namely, a portion of the chip mounting lead 22a that is held by and exposed from the laser chip mounting portion 37, has a heat release region 42 broader than a region for mounting the semiconductor laser chip 21, around the semiconductor laser chip 21. The region for mounting the semiconductor laser chip 21 includes a portion necessary for mounting the semiconductor laser chip 21, and the sub mount 26 is the portion necessary for mounting because the semiconductor laser chip 21 is mounted via the sub mount 26 in the present embodiment, so that the mounting region includes a portion contacting the sub mount 26 of the one surface 41. The heat release region 42 is formed so as to include the mounting region and extend around the portion contacting the sub mount 26. In the chip mounting lead 22a, a thickness parallel to the short side direction Y of the portion exposed from the laser chip mounting portion 37 is selected so as to be 0.4mm to 0.5 mm. In the one surface 41 of the chip mounting lead 22a, an area of the portion exposed from the laser chip mounting portion 37 is selected so as to be larger than an area of the contacting face with the sub mount 26, approximately 3 $mm^2$ to 4 $mm^2$. As such a heat release region 42 is formed, it is possible to cause the chip mounting lead 22a to conduct heat generated when the semiconductor laser chip 21 emits light via the sub mount 26, and quickly release the heat from the heat release region 42. Since the base 23 is made of synthetic resin, thermal conductivity is low. However, since it is possible to cause the chip mounting lead 22a made of metal having high thermal conductivity to conduct the heat from the semiconductor laser chip 21 and release the heat, it is possible to suppress increase of a temperature of the semiconductor laser chip 21 and suppress shortening of life of the semiconductor laser chip 21. The semiconductor laser device 20 is used at a surrounding temperature in a range of −20° C. to 80° C. A temperature of an emission center portion of the semiconductor laser chip 21 is about 200° C. However, as described before, in the case of providing the heat release region 42, a temperature of the chip mounting lead 22a is approximately in the range of −20° C. to 80° C. even if the heat is conducted via the sub mount 26, so that the chip mounting lead 22a does not peel off the base 23, and it is possible to favorably use the chip mounting lead 22a as a heat sink.

The cap 24 is integrally joined to the base 23 in a state of covering the protruding portion 31 on the face 33. The cap 24 is disposed so that a part of the face 33 protrudes outward from a circumference of the cap 24. The cap 24 has a side wall portion 24A extending along the emission direction Z, and a ceiling wall portion 24B that is connected with an end of the side wall portion 24A opposite to the face 33 and extends perpendicularly to the emission direction Z. The side wall portion 24A surrounds the protruding portion 31 around an axial line parallel to the emission direction Z. A space surrounded by an inner surface 36 of the cap 24 is formed into a substantially rectangular shape. The cap 24 makes it possible to certainly prevent that a mechanical shock is directly given to the semiconductor laser chip 21, the monitoring light receiving portion 27, the light receiving element 28 and the bonding wires 57.

An opening 35 is formed on the ceiling wall portion 24B of the cap 24 so as to face an emission end face 34 of the semiconductor laser chip 21. Since the opening 35 is formed, it is possible to emit the laser beam to the outside without blocking a laser beam emitted by the semiconductor laser chip 21 by the cap 24, though the protruding portion 31 is covered with the cap 24.

The cap 24 is made of synthetic resin. As a color of the synthetic resin making the cap 24, black is selected. In the present embodiment, the cap 24 is made of the same material as the base 23, namely, polyphenylene sulfide. Since the base 23 and the cap 24 are made of polyphenylene sulfide, it is possible to realize resin molding with excellent mass-productivity and stability, fine thermal resistance, and stable adhesion strength by ultrasonic fusion.

Since the color of the synthetic resin making the base 23 and the cap 24 is black, even if, for example, low-reflection plating or coating is not applied to the surface of the protruding portion 31 of the base 23 or the inner surface 36 of the cap 24, light heading toward the base 23 of light emitted by the semiconductor laser chip 21 is absorbed by the base 23, and light heading to the cap 24 is absorbed by the cap 24, whereby it is possible to suppress reflection on the inner surface 36 of the cap 24. Therefore, it is possible to suppress that light emitted by the semiconductor chip 21 is reflected on the surface of the base 23 and the inner surface 36 of the cap 24 and becomes disturbing light, and it is possible to suppress that the light is received as noise by the light receiving element 28.

Further, the inner surface 36 of the cap 24, namely, a face facing the protruding portion 31 is formed into a rough face. Surface roughness of the rough face is selected so that a maximum height Rmax is 10S to 20S (i.e., 10 μm to 20 μm). Since the inner surface 36 of the cap 24 is formed into a rough face, even if a laser beam emitted by the semiconductor laser chip 21 is reflected on the inner surface 36, the laser beam is scattered. Consequently, even if the laser beam reflected on the inner surface 36 is received by the light receiving element 28, it is possible to decrease an amount of light received as noise by the light receiving element 28.

In the case of forming the cap 24 by drawing a thin metal plate, a variance rate in the dimensional accuracy and the evenness is about 2%, but in the case of forming the cap by injection molding of synthetic resin, a variance rate in the dimensional accuracy and the evenness can be kept down to about 1%. By making the cap 24 with synthetic resin, it is possible to easily manufacture with higher dimensional accuracy and evenness compared with the case of drawing a thin metal plate.

A thickness T1 of the side wall portion 24A of the cap 24 is selected so as to be more than 0.2 mm. Consequently, it is possible to secure sufficient mechanical strength of the cap 24, and besides, stably seal with the cap 24. Moreover, the thickness T1 of the side wall portion 24A of the cap 24 is selected to as to be 0.5 mm or less. Consequently, it is possible to prevent that the cap 24 becomes large in size. It is possible to make the semiconductor laser device 20 small in size as the thickness T1 of the side wall portion 24A of the cap 24 is small, but when the thickness is too small, the cap 24 is deformed by ultrasonic vibrations at the time of ultrasonic fusion of the base 23 and the cap 24. In an experiment, when ultrasonic vibrations by which it is possible to obtain sufficient joint strength were given on the condition that a height of the cap 24, namely, a length in a direction along the emission direction Z of the cap 24 was 2.75 mm, the cap 24 was deformed in a case where the thickness T1 of the side wall portion 24A was 0.2 mm. In a case where the thickness T1 of the side wall portion 24A of the cap 24 was 0.4 mm, deformation of the cap 24 was not particularly recognized when the ultrasonic vibrations were given on the same condition, with the result that it was possible to accurately mount a hologram pattern 48 described later on the cap 24 with respect to the semiconductor laser chip 21 because the cap 24 was not deformed. By setting the thickness T1 of the side wall portion 24A of the cap 24 to 0.4 mm, it is possible to secure sufficient mechanical strength of the cap 24, and stably seal with the cap 24 without making the cap 24 large in size.

Further, the cap 24 is disposed so that the part of the face 33 protrudes a predetermined distance L1 outward from a circumferential face of the side wall portion 24A of the cap 24 in a normal direction of the circumferential face. The predetermined distance L1 is selected so as to be 0.4 mm or more. By thus making the part of the face 33 protrude outward from the cap 24, it is possible, when attaching the semiconductor laser device 20 to an attachment object, to stably attach in contact with the attachment object by using the face 33 as a reference face, with the result that it is possible to attach the semiconductor laser device 20 to the attachment object with stability. Moreover, the predetermined distance L1 is selected in a range of less than 0.8 mm. Consequently, it is possible to prevent that the face forming portion 30B on which the face 33 is formed becomes unnecessarily large and the semiconductor laser device 20 becomes large in size.

The respective electrode leads 22 are disposed so as to extend on the one side Z1 and the other side Z2 of the face 33 with respect to the emission direction Z. Of each of the electrode leads 22, one surface 74 of a portion held by the connecting portion 30C is partially exposed between the basal end and a portion closer to the free end with respect to the center in the emission direction Z of the connecting portion 30C, so that the electrode lead can be connected to an external component. In the connecting portion 30C, the electrode leads 22 are embedded in one surface portion and in the other surface portion in the short side direction Y, respectively. The portions held by the connecting portion 30C of the electrode leads 22 are arranged at equal intervals in the long side direction X. The respective electrode leads 22 are formed so that widths thereof in a direction along the long side direction X are different while thicknesses thereof are uniform.

The connecting portion 30C is formed into a substantially rectangular shape, and both ends in the long side direction X are curved protruding outward around an axial line along the emission direction Z. Grooves 40 are formed in the middle of the emission direction Z at each of four corners. A plurality of grooves 40 are formed in the emission direction Z, and two grooves are formed in the present embodiment. The grooves 40 of the four corners are formed by aligning on a virtual plane perpendicular to the emission direction Z. For example, when the free end of the connecting portion 30C becomes unnecessary after the semiconductor laser device 20 is mounted on a circuit board, it is possible to easily cut the connecting portion 30C together with the electrode leads 22 by moving a cutting tool along the grooves 40.

Of each of the electrode leads 22, a portion held at the free end of the connecting portion 30C is formed like a crank in a manner that each of the electrode leads 22 bends in the short side direction Y and then bends in the emission direction Z, a part of the portion is entirely embedded in the connecting portion 30C, and a tip portion 88 is exposed from the connecting portion 30C. Consequently, even if an undesirable shock is given to the connecting portion 30C, the electrode leads 22 are prevented from exfoliating.

Each of the electrode leads 22 is disposed in a manner that at least an end face on the one side Z1 in the emission direction Z of a portion held at the protruding portion 31 is exposed. Ends 56 on the one side Z1 in the emission direction Z of the portions held at the protruding portion 31 of the respective electrode leads 22 are exposed from the protruding portion 31. Each of the ends 56 is connected to one of the semiconductor laser chip 21, the monitoring light receiving portion 27 and the light receiving element 28 by the bonding wire 57. Each of the ends 56 is exposed from the protruding portion 31, and sandwiched by a part of the protruding portion 31 from both sides in the long side direction Z of the end 56. That is to say, all of the spaces between the ends 56 are filled with resin. Consequently, it is prevented that the respective ends 56 exposed from the protruding portion 31 are broken by mechanical contact, and moreover, it is prevented that the ends 56 are broken when the bonding wires are connected to the respective ends 56 by wire bonding, so that it is possible to increase reliability of connection, and it is possible to increase a yield rate.

Since predetermined electrode leads 22 of the plurality of electrode leads 22 are disposed on both sides in the short side direction Y of the light receiving element 28 mounted on the light receiving element mounting face 45, it is possible to connect the light receiving element 28 and the electrode leads 22 by the bonding wires 57 without crossing a light receiving face of the light receiving element 28, and it is possible to make the bonding wires 57 short, whereby it is possible to increase reliability of connection.

The respective electrode leads 22 are formed so that the widths thereof in the direction along the long side direction X are different as illustrated in FIGS. 2 and 3. Consequently, even if the portions held by the connecting portion 30C of the electrode leads 22 are formed at uniform intervals, it is possible to place the ends 56 on the one side in the emission direction Z of the electrode leads 22 so as to be close to the semiconductor laser chip 21, the light receiving element 28 or the monitoring light receiving portion 27, to which the ends should be connected.

An end 56a of the chip mounting lead 22a on the one side of the emission direction Z is formed so that an exposed portion exposed from the protruding portion 31 is smaller than a portion on which the semiconductor laser chip 21 is mounted along the shorter side direction Y. That is to say, a width in the long side direction X of the end 56a of the chip mounting lead 22a on the one side of the emission direction Z is selected so as to be smaller than a width in the long side direction X of the portion on which the semiconductor laser chip 21 is mounted of the chip mounting lead 22a. Consequently, it is possible to make an end face on the one side Z1 of the emission direction Z of the portion on which the semiconductor laser chip 21 is mounted of the chip mounting lead 22a contact the protruding portion 31, with the result that it is possible to increase a contact area between an end face around an axial line extending in the short side direction of a portion exposed at the protruding portion 31 of the chip mounting lead 22a and the protruding portion 31, and prevent that the chip mounting lead 22a exfoliates from the protruding portion 31.

The monitoring light receiving portion 27 is provided on the sub mount 26. The monitoring light receiving portion 27 is provided on the other side Z2 in the emission direction Z of the semiconductor laser chip 21 provided on the sub mount 26, and is used for measuring an amount of light of the semiconductor laser chip 21. The monitoring light receiving portion 27 is realized by a photodiode, and is integrally formed with the sub mount 26 made of a semiconductor material.

The ends 56 of the respective electrode leads 22 are individually connected to the semiconductor laser chip 21, the monitoring light receiving portion 27 and the light receiving element 28 by the bonding wires 57, thereby being capable of supplying electric power to the semiconductor laser chip 21, the monitoring light receiving portion 27 and the light receiving element 28 via the respective electrode leads 22, and detecting an electric current.

In the semiconductor laser device 20, the semiconductor laser chip 21 and the light receiving element 28 are fixed to the protruding portion 31 integrally formed with resin. That is to say, the semiconductor laser chip 21 and the light receiving element 28 are mounted on a single molded product formed with resin. Therefore, a relative position between the semiconductor laser chip 21 and the light receiving element 28 does not change at the time of assembly of the semiconductor laser device 20, and a variance rate in the relative position between the semiconductor laser chip 21 and the light receiving element 28 is reduced at the time of mass production, so that it is possible to realize a semiconductor laser device closer to design values, and increase a yield rate.

Further, since the light receiving element 28 is fixed to the electrically insulating base 23, it is possible to electrically insulate the semiconductor laser chip 21 and the light receiving element 28 only by directly fixing the light receiving element 28 to the base 23 by die bond without adding a special configuration such as an insulative film, and it is possible to suppress decrease of productivity.

The hologram element 29 is provided on the cap 24. The hologram element 29 has a base member 47, a hologram pattern 48 that is a hologram formed on a surface in a direction leaving the semiconductor laser chip 21, that is, one surface 47a of the base member 47 in the emission direction Z, and a tracking beam generating diffraction grating pattern 49 formed on the other surface 47b. The hologram pattern 48 and the tracking beam generating diffraction grating pattern 49 are formed by etching the base member 47 by photolithography. The base member 47 is made of a material having translucency that transmits a laser beam emitted by the semiconductor laser chip 21, for example, made of glass. The base member 47 is formed into a rectangular shape. The hologram pattern 48 forms a diffraction grating.

The opening 35 of the cap 24 is formed in a position that a center 35A thereof deviates from a center 78 of the ceiling wall portion 24B of the cap 24 when seen from the emission direction Z, and faces a part of the light receiving face 46 of the light receiving element 28.

The hologram pattern 48 is formed so that a center 51 thereof is shifted to a side of an end of the hologram element in a direction leaving the light receiving element 28 with respect to a center of the hologram element 29. Since it is only diffraction light diffracted toward the light receiving element 28 by the hologram pattern 48 that should be received by the light receiving element 28, even if the hologram pattern 48 is formed so that the center of the hologram pattern 48 is shifted to the side of the end of the hologram element in the direction leaving the light receiving element 28 with respect to the center of the hologram element 29, the diffraction light is transmitted by the base member 47 and received by the light receiving element 28 in the same manner as when the hologram pattern 48 is formed so that the center 51 thereof is aligned with the center of the base member 47. Accordingly, it becomes possible to downsize the hologram element 29 while maintaining performance and properties of the hologram pattern 48. The hologram element 29 is fixed to the cap 24 by an adhesive 52.

The aforementioned base 23 is formed in a manner that the base 23 is divided in the short side direction Y, and formed in a manner that first and second resin formed parts 23a and 23b each holding the electrode leads 22 are joined by ultrasonic fusion.

Figure 6:
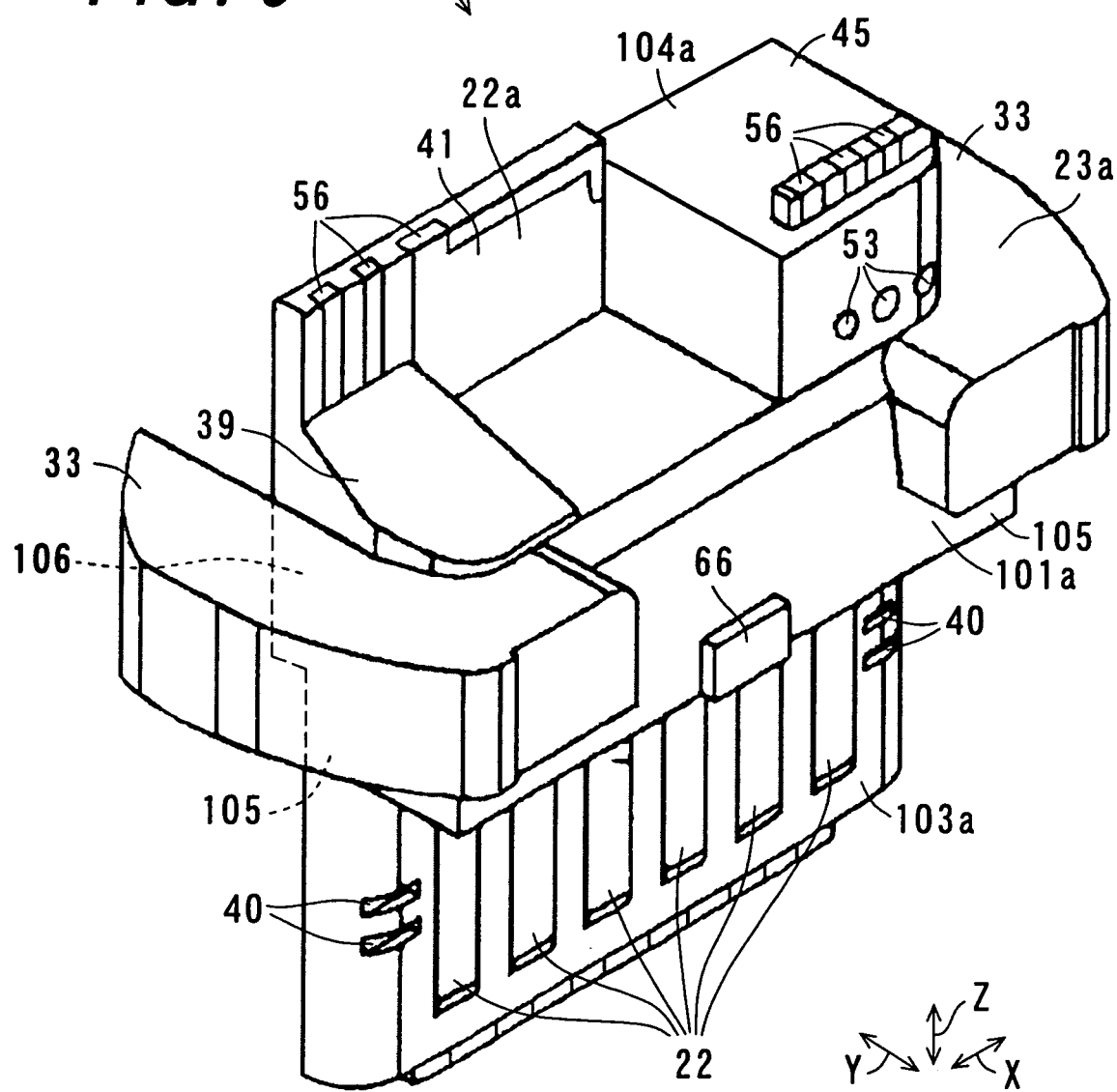
FIG. 6 is a perspective view illustrating a first assembly body composed of resin formed part and the electrode leads held by resin formed part.
Figure 7:
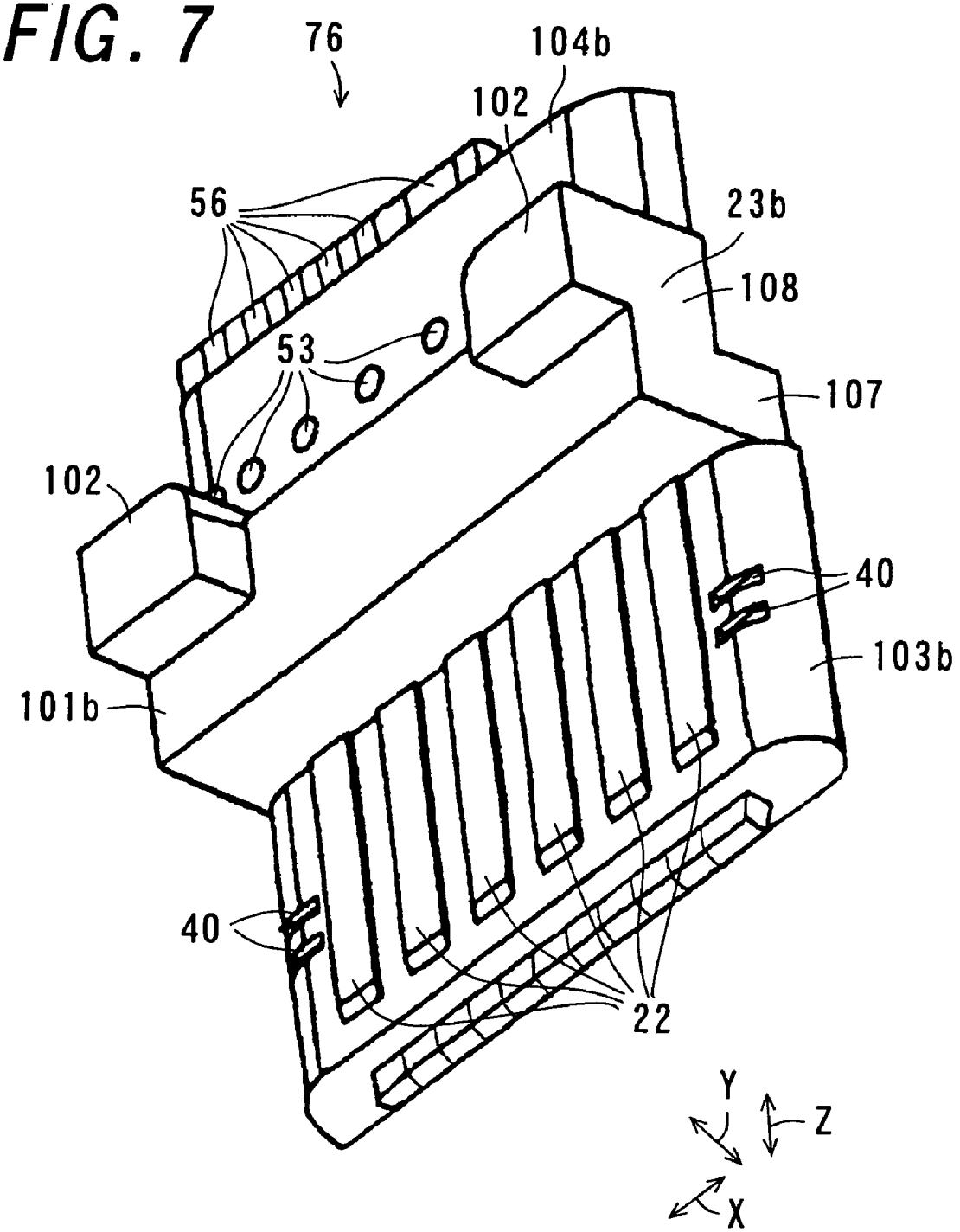
FIG. 7 is a perspective view illustrating a second assembly body composed of resin formation portion and the electrode leads held by resin formed part.

FIG. 6 is a perspective view illustrating a first assembly body 75 composed of the first resin formed part 23a and the electrode leads 22 held by the first resin formed part 23a, and FIG. 7 is a perspective view illustrating a second assembly body 76 composed of the second resin formed part 23b and the electrode leads 22 held by the second resin formed part 23b.

On the first resin formed part 23a that is one of the first and second resin formed parts 23a and 23b are formed the face 33, the light receiving element mounting face 45 and the chip mounting lead 22a. The first resin formed part 23a includes: a first base portion component 101a that is a part of the base portion 30A; the face forming portion 30B; a first connecting portion component 103a that is a part of the connecting portion 30C; and a first protruding portion component 104a that is a part of the protruding portion 31. The second resin formed part 23b includes: a second base portion component 101b that is the remaining part of the base portion 30A; a step component 102 that protrudes outward from the second base portion component 101b; a second connecting portion component 103b that is the remaining part of the connecting portion 30C; and a second protruding portion component 104b that is the remaining part of the protruding portion 31.

The first and second base portion components 101a and 101b are formed so that lengths thereof in the long side direction X are equal, the first and second connecting portion components 103a and 103b are formed so that lengths thereof in the long side direction X are equal, and the first and second protruding portion components 104a and 104b are formed so that lengths thereof in the long side direction X are equal. Regions contacting each other of the first and second base portion components 101a and 101b are formed into flat faces, regions contacting each other of the first and second connecting portion components 103a and 103b are formed into flat faces, and regions contacting each other in the long side direction X of the first and second protruding portion components 104a and 104b are formed into flat faces.

The first and second connecting portion components 103a and 103b are formed so as to be symmetrical with respect to a virtual plane perpendicular to the short side direction Y. A portion 105 connected with the first connecting portion component 103a of the first base portion component 101a is formed so as to have a smaller thickness in the short side direction Y than a portion 106 connected with the first protruding portion component 104a of the first base portion component 101a. A portion 107 connected with the second connecting portion component 103b of the second base portion component 101b is formed so as to have a larger thickness in the short side direction Y than a portion 108 connected with the second protruding portion component 104b of the second base portion component 101b. The portion 105 connected with the first connecting portion component 103a of the first base portion component 101a and the portion 107 connected with the second connecting portion component 103b of the second base portion component 101b face each other, and the portion 106 connected with the first protruding portion component 104a of the first base portion component 101a and the portion 108 connected with the second protruding portion component 104b of the second base portion component 101b face each other, whereby the base portion 30A having a substantially rectangular shape is formed.

The step component 102 is disposed so as to protrude opposite to a side where the second base portion component 101b protrudes, in the short side direction Y of the second base portion component 101b. The face forming portion 30B is formed extending on each side of the second base portion component 101b and extending to an end that is outside in the long side direction X of the step component 102. The first and second assembly bodies 75 and 76 are joined so that a surface on the one side Z1 in the emission direction Z of the step component 102 is perpendicular to the emission direction Z and is on the other side Z2 in the emission direction Z more than a surface on the one side Z1 in the emission direction Z of the face forming portion 30B. A distance L2 between a virtual plane including the surface on the one side Z1 in the emission direction Z of the step component 102 and a virtual plane including the face 33 that is the surface on the one side Z1 in the emission direction Z of the face forming portion 30B is selected so as to be 0 mm to 0.2 mm, for example.

The first and second resin formed parts 23a and 23b hold the plurality of electrode leads 22 aligned in the long side direction Z, respectively. Since the first and second resin formed parts 23a and 23b are joined in the short side direction Y, it is possible to join the first and second assembly bodies 75 and 76 holding the plurality of electrode leads 22 aligned in the long side direction X so that the electrode leads 22 of the first and second assembly bodies 75 and 76 become parallel. In the case of aligning the electrode leads in each of two directions and molding with resin as in the arts disclosed in JP-A 2002-232059 and JP-A 10-256649, it is necessary to hold the adjacent electrode leads in each of the two directions with high accuracy, and hence, it is difficult to form. However, by aligning only in a first direction, namely, the long side direction X and arranging the first and second assembly bodies 75 and 76 formed by molding with resin in a second direction, namely, the short side direction Y, it is possible to align the electrode leads 22 in each of the two directions with high accuracy to produce the semiconductor laser device 20.

Figure 8:
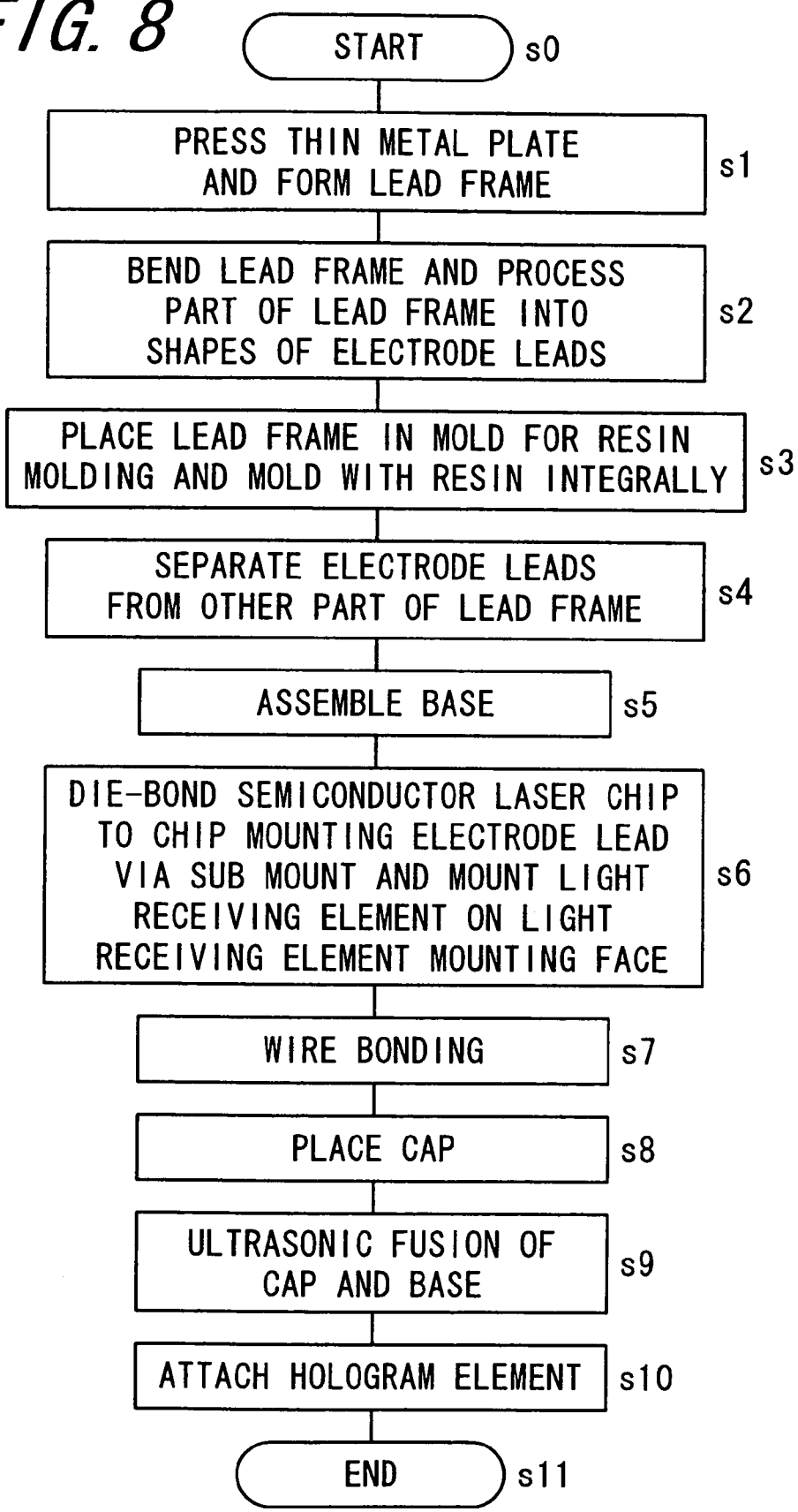
FIG. 8 is a flowchart illustrating a method for manufacturing the semiconductor laser device.

FIG. 8 is a flowchart illustrating a method for manufacturing the semiconductor laser device 20. When the method for manufacturing the semiconductor laser device 20 is started, the process goes from step s0 to step s1. At step s1, a thin metal plate is pressed to form the lead frame 61 (refer to FIG. 9), and then, the process goes to step s2. At step s2, the lead frame 61 is bent to process a part of the lead frame 61 into shapes of the respective electrode leads 22 described before, and then, the process goes to step s3. At step s3, the electrode leads 22 formed by the part of the lead frame 61 are placed in a mold for resin molding made of metal, PPS is injected into the mold for resin molding, and the resin formed parts 23a and 23b are formed integrally by injection molding.

Figure 9:
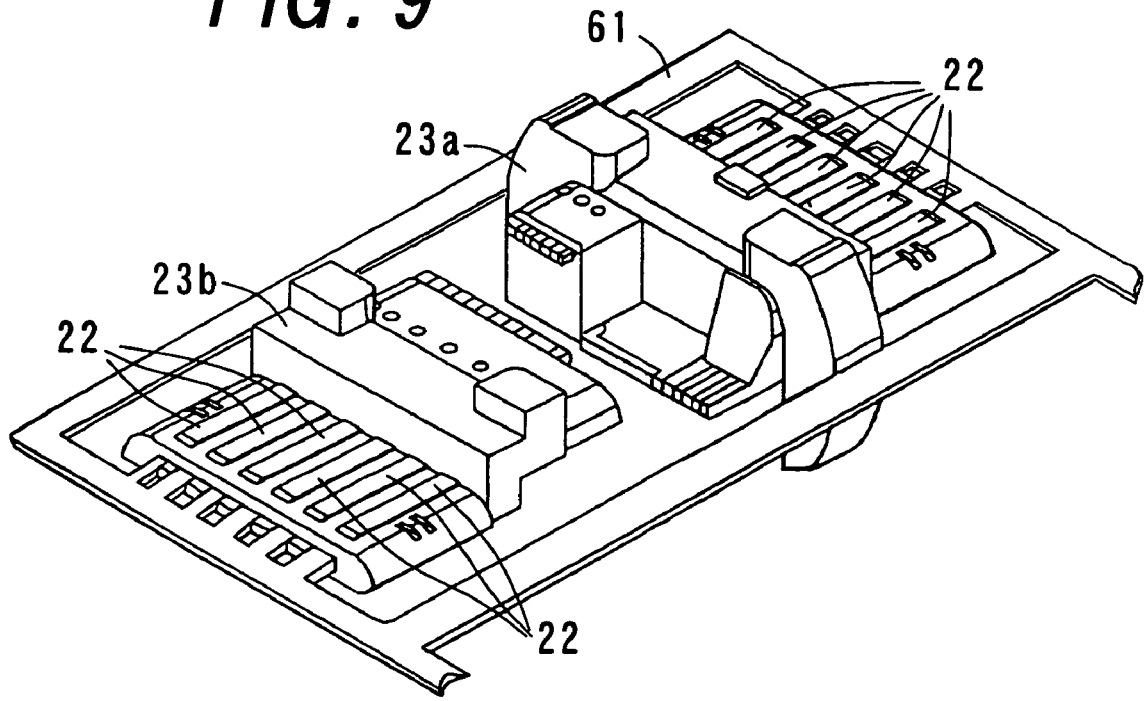
FIG. 9 is a perspective view illustrating the lead frame and the respective resin formed parts formed integrally therewith after step s3.

FIG. 9 is a perspective view illustrating the lead frame 61 and the respective resin formed parts 23a and 23b formed integrally with the lead frame 61 after step s3. Next, the process goes to step s4. At step s4, the electrode leads 22 are separated from the other part of the lead frame 61, and the first and second assembly bodies 75 and 76 as illustrated in FIGS. 6 and 7 are formed, and then, the process goes to step s5.

At step s5, the first and second assembly bodies 75 and 76 are assembled by ultrasonic fusion, and the base 23 is integrally formed therewith, and then, the process goes to step s6.

At step s6, the semiconductor laser chip 21 is die-bonded to the chip mounting lead 22a via the sub mount 26, and the light receiving element 28 is die-bonded and mounted on the light receiving element mounting face 45. Then, the process goes to step s7.

At step s7, the exposed potions of the portions held by the protruding portion 31 of the electrode leads 22 are wire-bonded to a specified region of the semiconductor laser chip 21, a specified region of the light receiving element 28 or a specified region of the monitoring light receiving portion 27, whereby the bonding wires 57 are connected.

Next, the process goes to step s8. At step s8, the cap 24 is placed on the face 33 so as to cover the protruding portion 31. At this moment, the cap 24 is placed so that the opening 35 thereof faces the emission end face 34 of the semiconductor laser chip 21.

Next, the process goes to step s9. At step s9, the base 23 and the cap 24 are joined by ultrasonic fusion. The base 23 and the cap 24 are held by a specified holding tool, and are given ultrasonic vibrations generated by an ultrasonic vibration generator that generates ultrasonic vibrations, via the holding tool. The ultrasonic vibrations are selected so as to be 15000 Hz or more. In ultrasonic fusion, heat is generated from frictional energy at a portion where the base 23 and the cap 24 contact, that is, between molecules of the resin making the face 33 of the base 23 and molecules of the resin making an end contacting the face 33 of the cap 24, whereby the base 23 and the cap 24 are joined.

In the case of joining synthetic resin and metal by ultrasonic fusion, it is impossible to obtain sufficient joint strength because different kinds of materials are joined, and a processing time for fusing becomes long because a melting point of metal is higher than that of synthetic resin. However, by forming the base 23 and the cap 24 with synthetic resin, it is possible to join in a short time period, and it is possible to increase productivity.

Further, by integrally joining the base 23 and the cap 24, it is possible to increase productivity without complicating the process because there is no need to adhere with an adhesive, and it is possible to make the device small in size because there is no need to form a region to apply the adhesive.

Figure 10:
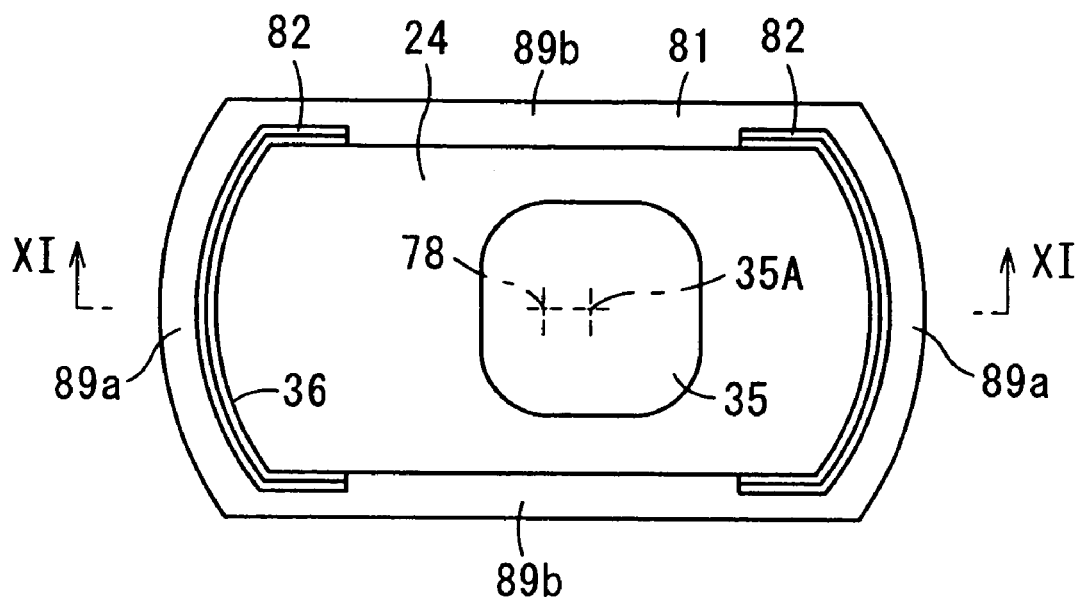
FIG. 10 is a bottom view illustrating a configuration of the cap joined to the basal potion.
Figure 11:
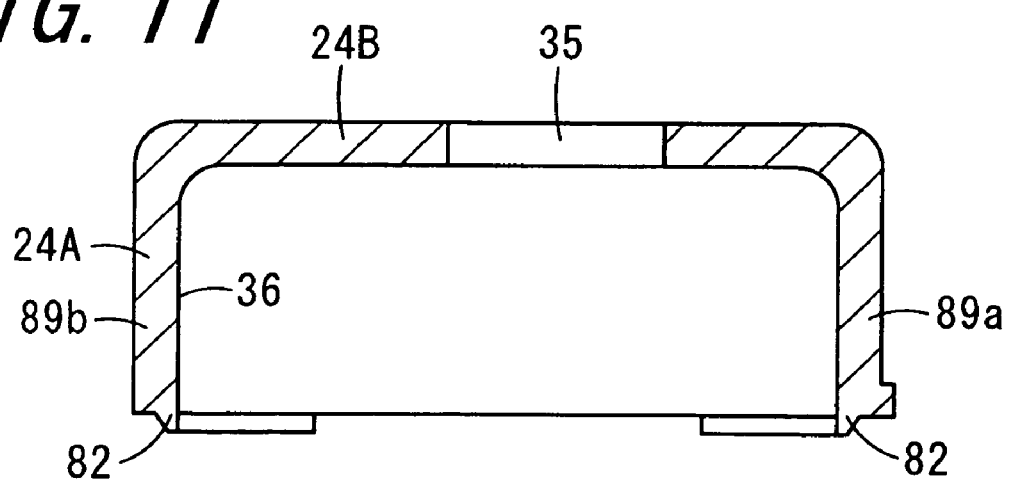
FIG. 11 is a cross section view of the cap taken on line XI-XI of FIG. 10.

FIG. 10 is a bottom view illustrating a configuration of the cap 24 joined to the basal potion 23, and FIG. 11 is a cross section view of the cap 24 taken on line XI-XI of FIG. 10. In order to certainly fix the base 23 and the cap 24 by ultrasonic fusion, a contact portion 81 of the cap 24 that contacts the face 33 of the base 23 is not formed into a flat face but formed so as to have a rib 82 at the portion contacting the face 33. Consequently, as compared with a case of forming the contact portion 81 of the cap 24 and that of the base 23 into flat faces, respectively, and making the flat faces contact each other, it is possible to reduce an area of the cap 24 contacting the base 23. As the contacting area is reduced, the cap 24 melts more easily at the time of ultrasonic fusion, and it is possible to join the base 23 and the cap 24 in a short time period.

The rib 82 is provided in a position abutting on the face 33, and is formed on each end in the long side direction X of the cap 24 so that a shape seen from the emission direction Z becomes a substantially U-letter shape. The rib 82 lies between ends in the short side direction Y of side wall portions 89a oriented to the long side direction X of the side wall portion 24A, and extends to ends in the long side direction X of side wall portions 89b oriented to the short side direction Y of the side wall portion 24A. A height of the rib 82 is set to 0.2 mm, for example.

A position and size of the rib 82 are selected so that molten resin of the rib 82 is not pressed out to the circumference of the cap 24 at the time of ultrasonic fusion. In the present embodiment, the rib 82 is formed at a bottom portion of the side wall portion 24A, closer to the inner surface 36 with respect to a center of the side wall portion 24A in a thickness direction of the side wall portion 24A. Consequently, it is possible to prevent that the molten resin of the rib 82 is pressed out to the circumference of the cap 24. The rib 82 is formed so as to become tapered from a basal end to a free end, and is formed so that a cross section shape by a virtual plane perpendicular to an extending direction becomes triangular.

In another embodiment of the invention, the rib 82 may be formed like, for example, a circular cone or a pyramid, and in this case, a plurality of ribs 82 are provided at predetermined intervals on the contacting portion 81.

The cap 24 is formed by injecting synthetic resin into a cap forming mold. A portion facing the inner surface 36 of the cap of the cap forming mold is formed into a rough face by blasting in advance. Consequently, it is possible to make the inner surface 36 rough simultaneously with formation of the cap 24. Since it is possible to form the cap 24 and make the inner surface 36 of the cap 24 rough simultaneously, it is possible to make the inner surface 36 of the cap 24 rough without increasing a process in production.

Although the resin making the base 23 and the cap 24 is polyphenylene sulfide in the above embodiment, the resin making the base 23 and the cap 24 may be a liquid crystal polymer, aromatic nylon or the like in another embodiment of the invention. Such resins are black in color, and are capable of achieving the same effect.

Further, although the wavelength of the light emitted by the semiconductor laser chip 21 is about 650 nm in the above embodiment, it is obvious that it is possible to achieve the effect of the invention regardless of the wavelength of the light emitted by the semiconductor laser chip 21, and it is needless to say that the wavelength of the light emitted by the semiconductor laser chip 21 may be about 780 nm, 400 nm or 1300 nm.

Figure 12:
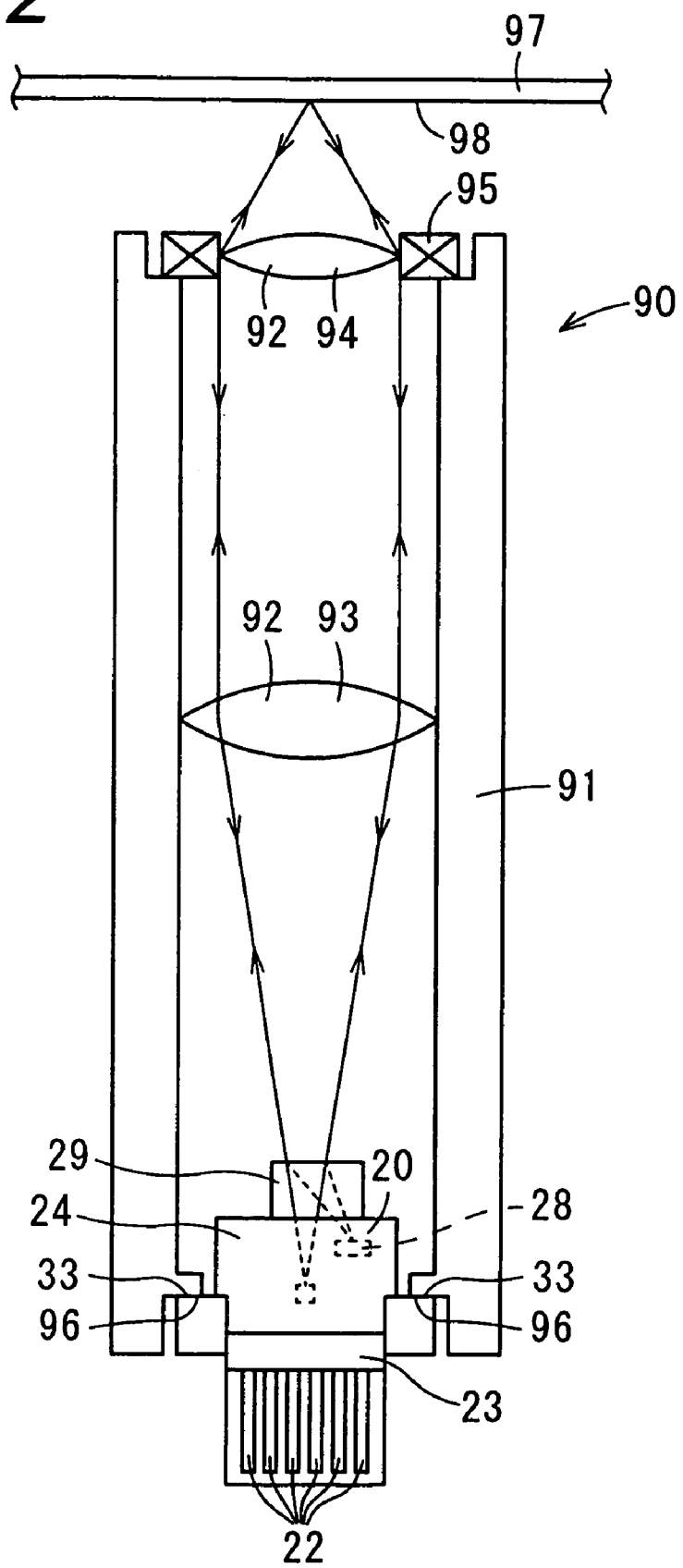
FIG. 12 is a schematic view illustrating a configuration of an optical pickup apparatus according to one embodiment of the invention equipped with a semiconductor laser device.

FIG. 12 is a schematic view illustrating a configuration of an optical pickup apparatus 90 according to one embodiment of the invention equipped with the semiconductor laser device 20. The optical pickup apparatus 90 is equipped with a chassis 91 and an optical system component 92, other than the semiconductor laser device 20. The chassis 91 integrally holds the semiconductor laser device 20 and the optical system component 92.

The optical system component 92 includes a collimation lens 93 and an object lens 94. The object lens 94 is held by a lens holding portion 95. The lens holding portion 95 is disposed so as to be moved by an actuator in an axial line direction and in a specified direction perpendicular to the axial line.

The chassis 91 has a contact face 96. The contact face 96 is a reference face, and the collimation lens 93 and the object lens 94 are disposed in the chassis 91 with reference to the contact face 96. The semiconductor laser device 20 is fixed to the chassis 91 in a state where the face 33 is in contact with the contact face 96. By keeping the face 33 of the semiconductor laser device 20 and the contact face 96 of the chassis 91 in contact with each other and fixing a relative position of the semiconductor laser device 20 and the chassis 91, it is possible to easily align a center axis of the laser beam emitted by the semiconductor laser chip 21 with the respective optical axes of the collimation lens 93 and the object lens 94, and it is possible to easily position the collimation lens 93 and the object lens 94 with a relative relation of the semiconductor laser chip 21, the light receiving element 28 and the hologram element 29. The laser beam is transmitted by the collimation lens 93 and the object lens 94, and condensed on a recording face 98 of an optical disk 97. The laser beam reflected by the recording face 98 of the optical disk 97 is transmitted by the object lens 94 and the collimation lens 93 in this order to return to the semiconductor laser device 20, and is diffracted by the hologram element 29 and received by the light receiving element 28.

An optical pickup apparatus of another embodiment of the invention may have a configuration that the aforementioned optical pickup apparatus 90 illustrated in FIG. 12 is equipped with a raising mirror for changing a traveling path of the beam, between the collimation lens 93 and the object lens 94. It is also possible to achieve the same effect as the optical pickup apparatus 90 with such a configuration, and it is possible to increase flexibility of design, by disposing the raising mirror to change an optical path of the laser beam.

A semiconductor laser device of another embodiment of the invention may have a configuration that the aforementioned semiconductor laser device 20 of the embodiment illustrated in FIG. 1 is not equipped with the light receiving element 28 or the hologram element 29. In this case, it is possible to use the semiconductor laser device 20 just as a light source.

In another embodiment of the invention, the face 33 may be formed by not a flat face but a face with a plurality of projections whose tip portions are made to have the same heights on a virtual plane perpendicular to the emission direction Z. Moreover, in another embodiment of the invention, a surface of a portion covered with the cap 24 of the base 23 may be formed into a rough face in the same manner as the inner surface 36 of the cap 24.

Figure 13:
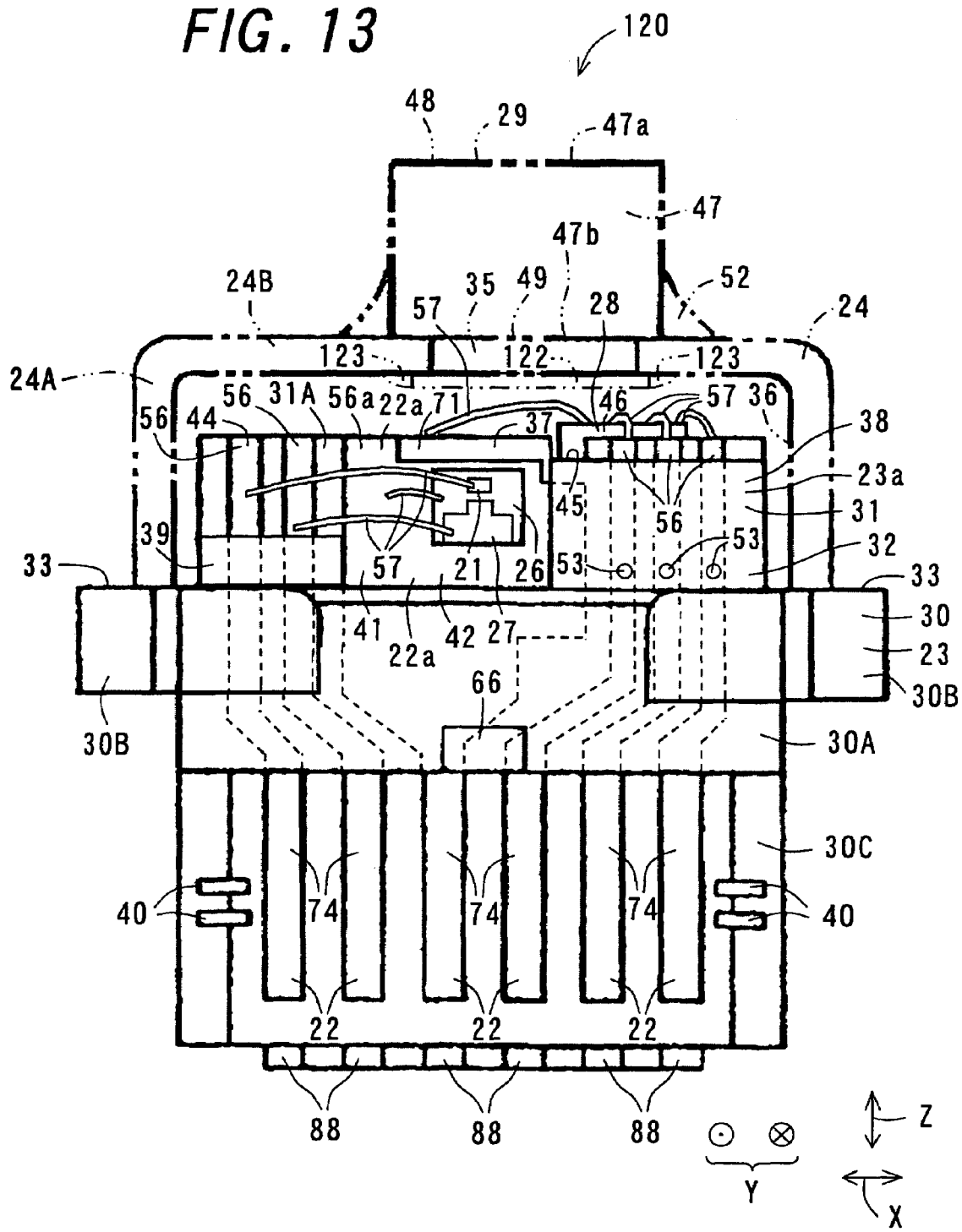
FIG. 13 is a front view illustrating a semiconductor laser device according to still another embodiment of the invention.
Figure 14:
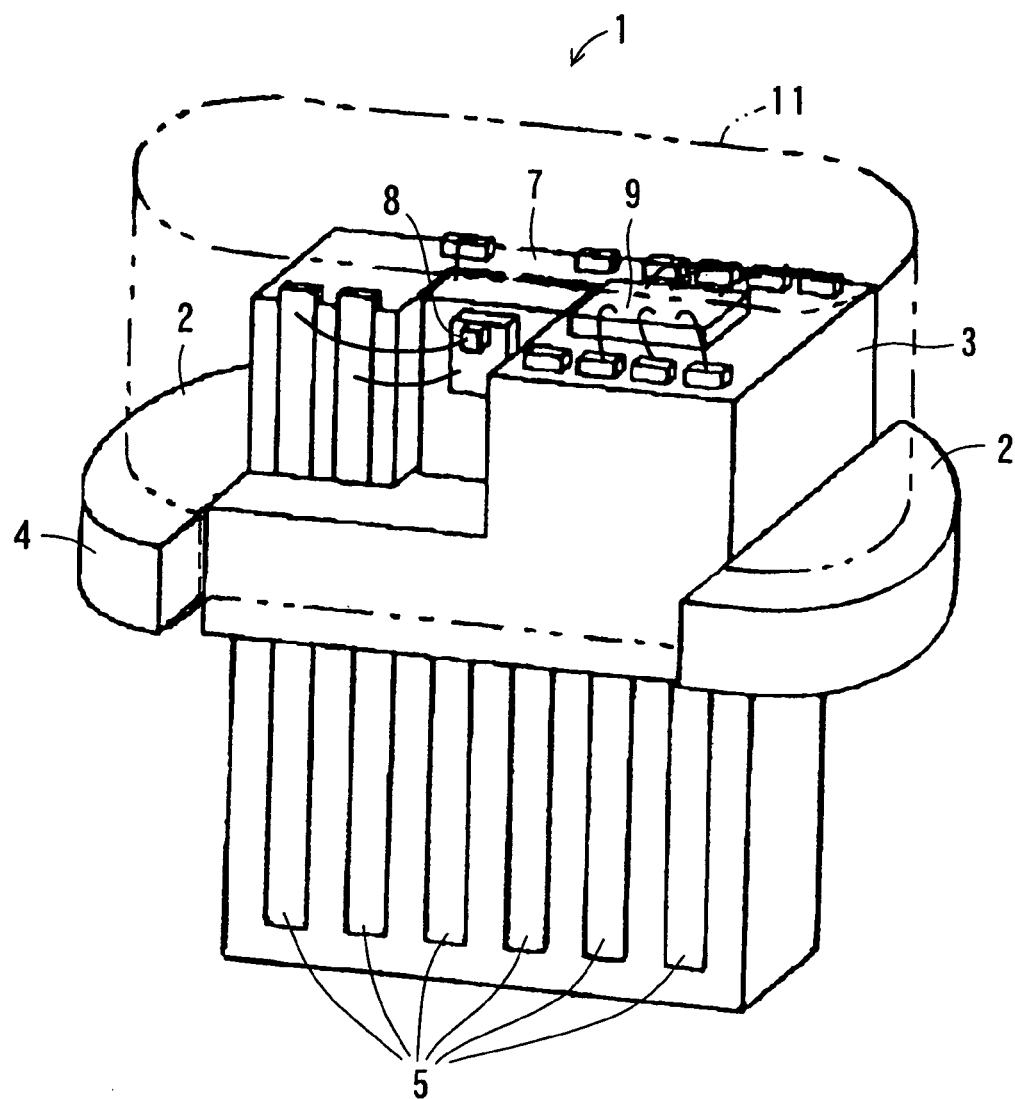
FIG. 14 is a perspective view illustrating a configuration of a semiconductor laser device of a related art.

FIG. 13 is a front view illustrating a semiconductor laser device 120 according to still another embodiment of the invention. Since the semiconductor laser device 120 of the present embodiment has a configuration similar to that of the aforementioned semiconductor laser device 20 of the embodiment illustrated in FIG. 1, similar portions will be denoted by the same reference numerals, and descriptions thereof will be omitted. In the semiconductor laser device 120, the opening 35 of the cap 24 of the aforementioned semiconductor laser device 20 is closed, and a light transmitting member 122 that transmits light having the predetermined wavelength which light is emitted by the semiconductor laser chip 21 is disposed. The light transmitting member 122 is made of glass, and is fixed to the inner surface 36 of the cap 24 by an adhesive 123. By disposing the light transmitting member 122, it is possible to certainly prevent that dust enters a space surrounded by the cap 24 without influencing the laser beam.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor laser device comprising:
   a semiconductor laser chip;
   a plurality of electrode leads that are electrically conductive, said plurality of electrode leads including a chip mounting electrode lead having an upper portion on which the semiconductor laser chip is mounted;
   a base made of synthetic resin arranged to hold the electrode leads in an embedded state, the base being electrically insulating and having a protruding portion through which the plurality of electrode leads are embedded, and a face formed at a basal end of the protruding portion to face an emission direction of a laser beam emitted by the semiconductor laser chip; and
   a cap made of the synthetic resin for the base, the cap having an opening formed so as to face an emission end face of the semiconductor laser chip, and being integrally joined to the base on the face of the base to cover the protruding portion,
   wherein one surface of the upper portion of the chip mounting electrode lead is exposed from the protruding portion, the one surface including a heat release region broader than a region of the chip mounting electrode lead on which the semiconductor laser chip is mounted.

2. The semiconductor laser device of claim 1, wherein a color of the synthetic resin of the cap is black.

3. The semiconductor laser device of claim 1, wherein an inner surface of the cap is formed into a rough face.

4. The semiconductor laser device of claim 1, wherein the cap is provided with a light transmitting member that closes the opening and transmits light having a predetermined wavelength which light is emitted by the semiconductor laser chip.

5. The semiconductor laser device of claim 1, wherein a thickness of a wall portion of the cap that is connected with the face formed at the basal end of the protruding portion is selected so as to be more than 0.2 mm, and the face formed at the basal end of the protruding portion protrudes 0.4 mm or more outwardly from a circumference of the cap.

6. The semiconductor laser device of claim 5, wherein the thickness of the wall portion of the cap that is connected with the face formed at the basal end of the protruding portion is set to 0.4 mm.

7. The semiconductor laser device of claim 1, wherein a space between the electrode leads is filled with the base.

8. The semiconductor laser device of claim 1, further comprising a light receiving element disposed in the protruding portion,
   wherein the base is formed by joining two resin formed parts each of which holds the electrode leads, and one of which has the face formed at the basal end of the protruding portion, the electrode lead for chip mounting and a region on which the light receiving element is mounted.

9. The semiconductor laser device of claim 8, further comprising a hologram element that is disposed in the cap and includes a light transmitting base member having a surface in a direction leaving the semiconductor laser chip on which surface a hologram pattern is formed, wherein the hologram pattern is formed so that a center thereof is shifted to a side of an end of the hologram element in a direction leaving the light receiving element with respect to a center of the hologram element.

10. The semiconductor laser device of 1, wherein the base and the cap are made of polyphenylene sulfide.

11. An optical pickup apparatus comprising: the semiconductor laser device of claim 1;

a chassis member having a contact face contacting the face formed at the basal end of the protruding portion of the semiconductor laser device; and an optical system member disposed in the chassis member with reference to the contact face.

* * * * *